(12) United States Patent
Natarajan et al.

(10) Patent No.: US 10,778,556 B2
(45) Date of Patent: Sep. 15, 2020

(54) EFFICIENT MESH NETWORK DATA GATHERING

(71) Applicant: Intel Corporation, Santa Clara, CA (US)

(72) Inventors: Venkat Natarajan, Bangalore (IN); Kumar Ranganathan, Bangalore (IN); Jaroslaw J. Sydir, San Jose, CA (US); Apoorv Vyas, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 15/856,994

(22) Filed: Dec. 28, 2017

(65) Prior Publication Data

US 2019/0036801 A1    Jan. 31, 2019

(51) Int. Cl.

| | |
|---|---|
| *G06F 15/16* | (2006.01) |
| *H04L 12/26* | (2006.01) |
| *H04L 12/721* | (2013.01) |
| *H04L 29/08* | (2006.01) |
| *H04L 12/753* | (2013.01) |
| *H04L 12/66* | (2006.01) |
| *H03M 7/30* | (2006.01) |

(52) U.S. Cl.
CPC ...... *H04L 43/0888* (2013.01); *H03M 7/3062* (2013.01); *H04L 12/66* (2013.01); *H04L 43/022* (2013.01); *H04L 45/12* (2013.01); *H04L 45/48* (2013.01); *H04L 67/12* (2013.01)

(58) Field of Classification Search
CPC ... H04L 12/66; H04L 43/022; H04L 43/0888; H04L 45/12; H04L 45/48; H04L 67/12
See application file for complete search history.

(56) References Cited

U.S. PATENT DOCUMENTS

| | | | |
|---|---|---|---|
| 6,606,303 B1* | 8/2003 | Hassel | H04L 45/04 370/238 |
| 2009/0135717 A1 | 5/2009 | Kamal et al. | |
| 2010/0212013 A1* | 8/2010 | Kim | H04L 45/00 726/23 |

(Continued)

FOREIGN PATENT DOCUMENTS

WO    2019133109    7/2019

OTHER PUBLICATIONS

Lou, Chong, et al., "Compressive Data Gathering for Large-Scale Wireless Sensor Networks", MobiCom'09, Beijing, China ACM 978-1-60558-702-8/09/09, (2009), 145-156.

(Continued)

*Primary Examiner* — Normin Abedin
(74) *Attorney, Agent, or Firm* — Schwegman Lundberg & Woessner, P.A.

(57) ABSTRACT

Systems and methods may be used to map and collect data from a mesh network at a gateway device connecting a plurality of devices (e.g., edge devices, IoT devices, sensors, or the like) to a network. A method may include determining a shortest path tree (SPT) map of the plurality of devices, the shortest path tree map may define the mesh network for the plurality of devices connected to the gateway. The method may include sampling data throughout the mesh network based on a compressive sensing (CS) sampling schedule. The sampled data may be output, such as to a remote device via the network. The sampled data may be saved at the gateway.

25 Claims, 11 Drawing Sheets

(56) References Cited

U.S. PATENT DOCUMENTS

| | | | | |
|---|---|---|---|---|
| 2011/0191496 A1* | 8/2011 | Luo | ............... | G06F 15/16 |
| | | | | 709/247 |
| 2014/0219275 A1* | 8/2014 | Allan | ............... | H04L 45/16 |
| | | | | 370/390 |
| 2017/0201297 A1* | 7/2017 | Stratigos, Jr. | ............... | H04L 27/06 |

OTHER PUBLICATIONS

Quer, Giorgio, et al., "On the Interplay Between Routing and Signal Representation for Compressive Sensing in Wireless Sensor Networks", 10 pgs.

"International Application Serial No. PCT US2018 059433, International Search Report dated Feb. 13, 2019", 3 pgs.

"International Application Serial No. PCT US2018 059433, Written Opinion dated Feb. 13, 2019", 7 pgs.

* cited by examiner

EFFICIENT MESH NETWORK DATA GATHERING

TECHNICAL FIELD

Embodiments described herein generally relate to processing techniques for data gathering used with data communications and interconnected device networks, and in particular, to techniques applied within internet of things (IoT) devices and device networks.

BACKGROUND

IoT devices are physical objects that may communicate on a network, and may include sensors, actuators, and other input/output components, such as to collect data or perform actions from a real world environment. For example, IoT devices may include low-powered devices that are embedded or attached to everyday things, such as buildings, vehicles, packages, etc., to provide an additional level of artificial sensory perception of those things. Recently, IoT devices have become more popular and thus applications using these devices have proliferated.

Wireless sensor networks (WSN) have many IoT applications that measure spatially-distributed sparse sensor fields (e.g., temperature, pressure, humidity, etc.). For example, WSNs in cold chain logistics enable real-time monitoring of sparse temperature fields ranging from several weeks to months. In particular, spatial WSNs in a mesh (e.g., a tree) topology are scalable to large network sizes with greater coverage. Techniques traditionally used to calculate the best routing schedule suffer from limitations, such as having data throughput that rises sharply in relay nodes that are closest to a gateway causing severe load balancing problems, or requiring all nodes in the network participate in the data gathering process, which causes high network power consumption, especially when the sensor field is sparse.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
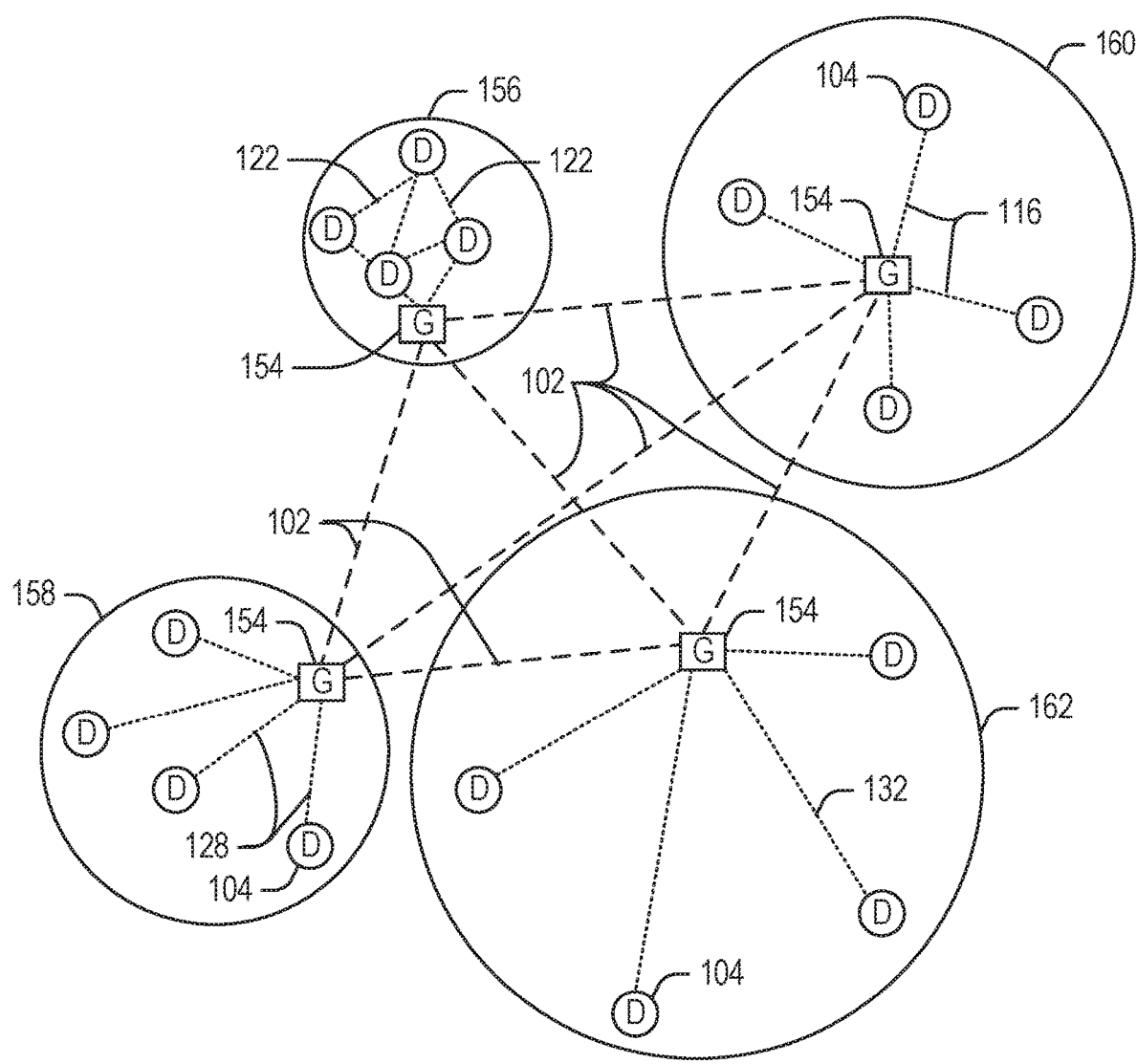
FIG. 1 illustrates a domain topology for respective internet-of-things (IoT) networks coupled through links to respective gateways in accordance with some embodiments.

Systems and methods for mapping and collecting data from a mesh network are described herein. The mesh network described herein may include a gateway device used to collect the data or map the mesh network. The mesh network described herein may include a plurality of IoT devices, edge devices, sensors, etc., which are mapped or used for data collection.

In an example, a Shortest Path Tree (SPT) algorithm is used to calculate a route for the mesh network. The SPT algorithm, however, when used with path cost calculated based only on radio conditions and a simple data collection application that has every node read sensor data and send it to the gateway (along the paths calculated by the SPT algorithm) has two major limitations. First, the data throughput may be larger in relay nodes that are closest to a gateway causing load balancing problems where the relay nodes consume more power (~4X) than the edge or leaf nodes. Second, the SPT algorithm relies on all nodes of the network to participate in the data gathering process, even when the sensor field is sparse, which may cause high network power consumption.

The SPT algorithm considers network parameters such as radio range, topology, etc. However, the SPT algorithm does not take into consideration properties of the mesh network (e.g., a measured sensor field). The SPT approach may result in sub-optimal and power-inefficiencies or data gathering for IoT applications, especially those that include sparse sensor fields (e.g., temperature, humidity, pressure, etc.).

In an example, compressive sensing (CS) may be used as a technique to exploit data properties of sparse sensor fields, and may be used for power-efficient sampling in WSNs. However, these efforts may be limited by not taking into consideration the topology of real-world WSNs, being instead based on idealistic models (e.g., a fully connected mesh network). The CS by itself does not address the real-world constraints of a practical sensor network deployment, specifically detecting and localizing anomalies or events in a spatial sensor network, while also aggregating data power-efficiently.

In the systems and methods described herein, an end-to-end data aggregation scheme is used that overcomes the limitations of the SPT-only based approach (e.g., poor load balancing and high power consumption) as well as the CS-only based approach (e.g., power efficiency). By using the CS technique with the SPT routing together, which may be referred to herein as CS-SPT, efficiencies may be achieved, such as in load balancing, power-efficiency, or increasing network lifetime. The CS-SPT technique may work with any WSN topology.

The CS-SPT technique includes an SPT portion of the technique to generate a set of optimal routes using network parameters (e.g., radio-range, topology). The CS-SPT technique includes a CS portion of the technique to determine a power-efficient data gathering schedule using structural properties of a sensor field mapped by the SPT portion, such as without considering aspects of the underlying wireless sensor network (e.g., radio-range or topology). Using the CS portion of the technique includes causing a parent node to send one encoded (e.g., linearly combined) reading for children of the parent node along a routing path (e.g., all children), which may result in a load-balanced transmission (e.g., fewer transmissions through nodes close to the gateway resulting in improved load balancing). The encoded reading may include a linear combination of sensor readings along a routing path (e.g., as determined by the SPT portion of the technique) creating a single data transmission from, for example, every node along any given route. The CS portion of the technique replaces the SPT-only data gathering approach, which relies on a sensor reading from each child being progressively concatenated along a routing path.

In an example, the CS portion of the technique may, when the sensor field is sparse, minimize the number of nodes that participate in the data gathering process by using optimization methods to recover the sensor field. This approach eliminates redundant measurements to save network power consumption.

The CS portion of the technique uses a data gathering scheme that relies on a suitable network route to the gateway existing (without specifying what that optimal route should be). In the systems and methods described herein, that route may be first decided by the SPT portion of the technique. The CS data-gathering schedule may then be superposed on the SPT route or routes. The resulting sampling schedule from the CS portion of the technique overlaid on a SPT route may achieve load balancing or minimize network power consumption in a WSN mesh (e.g., for sparse data fields). The resulting sampling schedule may deliver a best routing tree for an IoT mesh or tree network or minimize data throughput, such as for a bottleneck relay node close to the gateway.

FIG. 1 illustrates an example domain topology for respective internet-of-things (IoT) networks coupled through links to respective gateways. The Internet of things (IoT) is a concept in which a large number of computing devices are interconnected to each other and to the Internet to provide functionality and data acquisition at very low levels. Thus, as used herein, an IoT device may include a semiautonomous device performing a function, such as sensing or control, among others, in communication with other IoT devices and a wider network, such as the Internet.

Often, IoT devices are limited in memory, size, or functionality, allowing larger numbers to be deployed for a similar cost to smaller numbers of larger devices. In an example, IoT devices are often battery operated with limited battery capacity. IoT devices are often required to operate for long periods of time without charging or replacing the batteries. The techniques described herein may be used to reduce power consumption for power-constrained devices. In another example, an IoT device may be a smart phone, laptop, tablet, or PC, or other larger device. Further, an IoT device may be a virtual device, such as an application on a smart phone or other computing device. IoT devices may include IoT gateways, used to couple IoT devices to other IoT devices and to cloud applications, for data storage, process control, and the like.

Networks of IoT devices may include commercial and home automation devices, such as water distribution systems, electric power distribution systems, pipeline control systems, plant control systems, light switches, thermostats, locks, cameras, alarms, motion sensors, sensor nodes (e.g., nodes that monitor environmental conditions, air quality, vibration, etc.) and the like. The IoT devices may be accessible through remote computers, servers, and other systems, for example, to control systems or access data.

Figure 2:
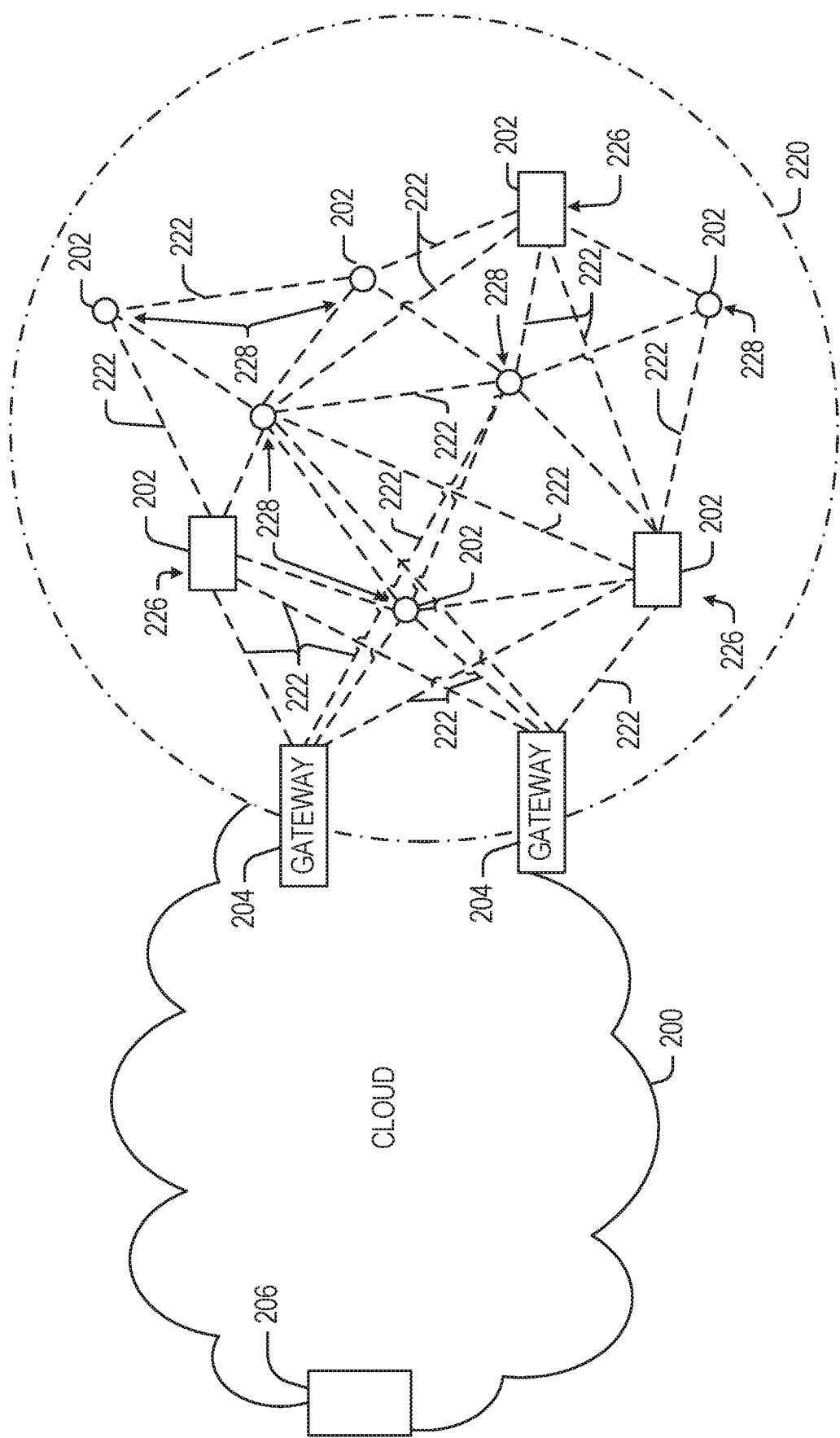
FIG. 2 illustrates a cloud computing network in communication with a mesh network of IoT devices operating as a fog device at the edge of the cloud computing network in accordance with some embodiments.

The future growth of the Internet and like networks may involve very large numbers of IoT devices. Accordingly, in the context of the techniques discussed herein, a number of innovations for such future networking will address the need for all these layers to grow unhindered, to discover and make accessible connected resources, and to support the ability to hide and compartmentalize connected resources. Any number of network protocols and communications standards may be used, wherein each protocol and standard is designed to address specific objectives. Further, the protocols are part of the fabric supporting human accessible services that operate regardless of location, time or space. The innovations include service delivery and associated infrastructure, such as hardware and software; security enhancements; and the provision of services based on Quality of Service (QoS) terms specified in service level and service delivery agreements. As will be understood, the use of IoT devices and networks, such as those introduced in FIGS. 1 and 2, present a number of new challenges in a heterogeneous network of connectivity comprising a combination of wired and wireless technologies.

FIG. 1 specifically provides a simplified drawing of a domain topology that may be used for a number of internet-of-things (IoT) networks comprising IoT devices 104, with the IoT networks 156, 158, 160, 162, coupled through backbone links 102 to respective gateways 154. For example, a number of IoT devices 104 may communicate with a gateway 154, and with each other through the gateway 154. To simplify the drawing, not every IoT device 104, or communications link (e.g., link 116, 122, 128, or 132) is labeled. The backbone links 102 may include any number of wired or wireless technologies, including optical networks, and may be part of a local area network (LAN), a wide area network (WAN), or the Internet. Additionally, such communication links facilitate optical signal paths among both IoT devices 104 and gateways 154, including the use of MUXing/deMUXing components that facilitate interconnection of the various devices.

The network topology may include any number of types of IoT networks, such as a mesh network provided with the network 156 using Bluetooth low energy (BLE) links 122. Other types of IoT networks that may be present include a wireless local area network (WLAN) network 158 used to communicate with IoT devices 104 through IEEE 802.11 (Wi-Fi®) links 128, a cellular network 160 used to communicate with IoT devices 104 through an LTE/LTE-A (4G) or 5G cellular network, and a low-power wide area (LPWA) network 162, for example, a LPWA network compatible with the LoRaWan specification promulgated by the LoRa alliance, or a IPv6 over Low Power Wide-Area Networks (LPWAN) network compatible with a specification promulgated by the Internet Engineering Task Force (IETF). Further, the respective IoT networks may communicate with an outside network provider (e.g., a tier 2 or tier 3 provider) using any number of communications links, such as an LTE cellular link, an LPWA link, or a link based on the IEEE 802.15.4 standard, such as Zigbee®. The respective IoT networks may also operate with use of a variety of network and internet application protocols such as Constrained Application Protocol (CoAP). The respective IoT networks may also be integrated with coordinator devices that provide a chain of links that forms cluster tree of linked devices and networks.

Each of these IoT networks may provide opportunities for new technical features, such as those as described herein. The improved technologies and networks may enable the exponential growth of devices and networks, including the use of IoT networks into as fog devices or systems. As the use of such improved technologies grows, the IoT networks may be developed for self-management, functional evolution, and collaboration, without needing direct human intervention. The improved technologies may even enable IoT networks to function without centralized controlled systems. Accordingly, the improved technologies described herein may be used to automate and enhance network management and operation functions far beyond current implementations.

In an example, communications between IoT devices 104, such as over the backbone links 102, may be protected by a decentralized system for authentication, authorization, and accounting (AAA). In a decentralized AAA system, distributed payment, credit, audit, authorization, and authentication systems may be implemented across interconnected heterogeneous network infrastructure. This allows systems and networks to move towards autonomous operations. In these types of autonomous operations, machines may even contract for human resources and negotiate partnerships with other machine networks. This may allow the achievement of mutual objectives and balanced service delivery against outlined, planned service level agreements as well as achieve solutions that provide metering, measurements, traceability and trackability. The creation of new supply chain structures and methods may enable a multitude of services to be created, mined for value, and collapsed without any human involvement.

Such IoT networks may be further enhanced by the integration of sensing technologies, such as sound, light, electronic traffic, facial and pattern recognition, smell, vibration, into the autonomous organizations among the IoT devices. The integration of sensory systems may allow systematic and autonomous communication and coordination of service delivery against contractual service objectives, orchestration and quality of service (QoS) based swarming and fusion of resources. Some of the individual examples of network-based resource processing include the following.

The mesh network 156, for instance, may be enhanced by systems that perform inline data-to-information transforms. For example, self-forming chains of processing resources comprising a multi-link network may distribute the transformation of raw data to information in an efficient manner, and the ability to differentiate between assets and resources and the associated management of each. Furthermore, the proper components of infrastructure and resource based trust and service indices may be inserted to improve the data integrity, quality, assurance and deliver a metric of data confidence.

The WLAN network 158, for instance, may use systems that perform standards conversion to provide multi-standard connectivity, enabling IoT devices 104 using different protocols to communicate. Further systems may provide seamless interconnectivity across a multi-standard infrastructure comprising visible Internet resources and hidden Internet resources.

Communications in the cellular network 160, for instance, may be enhanced by systems that offload data, extend communications to more remote devices, or both. The LPWA network 162 may include systems that perform non-Internet protocol (IP) to IP interconnections, addressing, and routing. Further, each of the IoT devices 104 may include the appropriate transceiver for wide area communications with that device. Further, each IoT device 104 may include other transceivers for communications using additional protocols and frequencies. This is discussed further with respect to the communication environment and hardware of an IoT processing device depicted in FIGS. 10 and 11.

Finally, clusters of IoT devices may be equipped to communicate with other IoT devices as well as with a cloud network. This may allow the IoT devices to form an ad-hoc network between the devices, allowing them to function as a single device, which may be termed a fog device. This configuration is discussed further with respect to FIG. 2 below.

FIG. 2 illustrates a cloud computing network in communication with a mesh network of IoT devices (devices 202) operating as a fog device at the edge of the cloud computing network. The mesh network of IoT devices may be termed a fog 220, operating at the edge of the cloud 200. To simplify the diagram, not every IoT device 202 is labeled.

The fog 220 may be considered to be a massively interconnected network wherein a number of IoT devices 202 are in communications with each other, for example, by radio links 222. As an example, this interconnected network may be facilitated using an interconnect specification released by the Open Connectivity Foundation™ (OCF). This standard allows devices to discover each other and establish communications for interconnects. Other interconnection protocols may also be used, including, for example, the optimized link state routing (OLSR) Protocol, the better approach to mobile ad-hoc networking (B.A.T.M.A.N.) routing protocol, or the OMA Lightweight M2M (LWM2M) protocol, among others.

Three types of IoT devices 202 are shown in this example, gateways 204, data aggregators 226, and sensors 228, although any combinations of IoT devices 202 and functionality may be used. The gateways 204 may be edge devices that provide communications between the cloud 200 and the fog 220, and may also provide the backend process function for data obtained from sensors 228, such as motion data, flow data, temperature data, and the like. The data aggregators 226 may collect data from any number of the sensors 228, and perform the back end processing function for the analysis. The results, raw data, or both may be passed along to the cloud 200 through the gateways 204. The sensors 228 may be full IoT devices 202, for example, capable of both collecting data and processing the data. In some cases, the sensors 228 may be more limited in functionality, for example, collecting the data and allowing the data aggregators 226 or gateways 204 to process the data.

Communications from any IoT device 202 may be passed along a convenient path (e.g., a most convenient path) between any of the IoT devices 202 to reach the gateways 204. In these networks, the number of interconnections provide substantial redundancy, allowing communications to be maintained, even with the loss of a number of IoT devices 202. Further, the use of a mesh network may allow IoT devices 202 that are very low power or located at a distance from infrastructure to be used, as the range to connect to another IoT device 202 may be much less than the range to connect the gateways 204.

The fog 220 provided from these IoT devices 202 may be presented to devices in the cloud 200, such as a server 206, as a single device located at the edge of the cloud 200, e.g., a fog device. In this example, the alerts coining from the fog device may be sent without being identified as coming from a specific IoT device 202 within the fog 220. In this fashion, the fog 220 may be considered a distributed platform that provides computing and storage resources to perform processing or data-intensive tasks such as data analytics, data aggregation, and machine-leaning, among others.

In some examples, the IoT devices 202 may be configured using an imperative programming style, e.g., with each IoT device 202 having a specific function and communication partners. However, the IoT devices 202 forming the fog device may be configured in a declarative programming style, allowing the IoT devices 202 to reconfigure their operations and communications, such as to determine needed resources in response to conditions, queries, and device failures. As an example, a query from a user located at a server 206 about the operations of a subset of equipment monitored by the IoT devices 202 may result in the fog 220 device selecting the IoT devices 202, such as particular sensors 228, needed to answer the query. The data from these sensors 228 may then be aggregated and analyzed by any combination of the sensors 228, data aggregators 226, or gateways 204, before being sent on by the fog 220 device to the server 206 to answer the query. In this example, IoT devices 202 in the fog 220 may select the sensors 228 used based on the query, such as adding data from flow sensors or temperature sensors. Further, if some of the IoT devices 202 are not operational, other IoT devices 202 in the fog 220 device may provide analogous data, if available.

Figure 3:
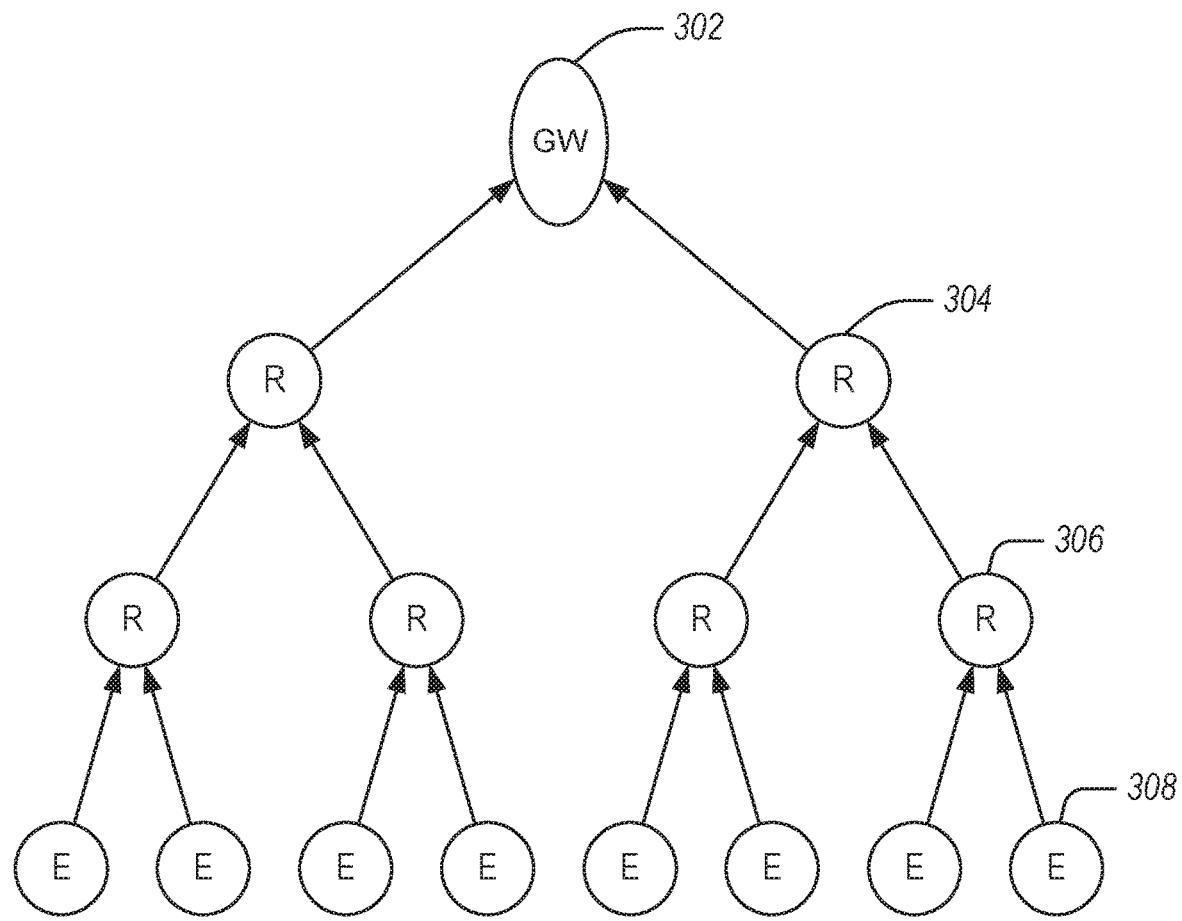
FIG. 3 illustrates a mesh network used in asset tracking in accordance with some embodiments.

FIG. 3 illustrates a mesh network 300 used in asset tracking in accordance with some embodiments. The mesh network 300 includes a gateway device 302, a first parent node 304, a second parent node 306 (which is itself a child node of the first parent node 304), and a child node 308. The parent nodes 304 or 306 may also be called relay nodes, and the child node 308 may also be called an edge or end or terminal node.

The mesh network 300 (also called a tree) may be used in asset tracking. The routes of the mesh network 300 may be determined using an SPT portion of a CS-SPT technique, for example, by using a breadth-first search tree, Dijkstra's algorithm, Bellman-Ford algorithm, using a minimum number of edges between nodes, or the like, for example to communicatively connect the gateway 302 to each node (e.g., via other nodes). The CS portion of the technique may include data gathering using data sparsity in the mesh network 300 to reduce data throughput and power consumption. The CS-SPT technique includes cyclical route sampling combined with an adaptive CS schedule. In an example, the CS-SPT technique may be used in conjunction with complementary hardware-assisted technologies, such as a wake-up-radio to cut idle-listening or transmission power in the network.

Figure 4:
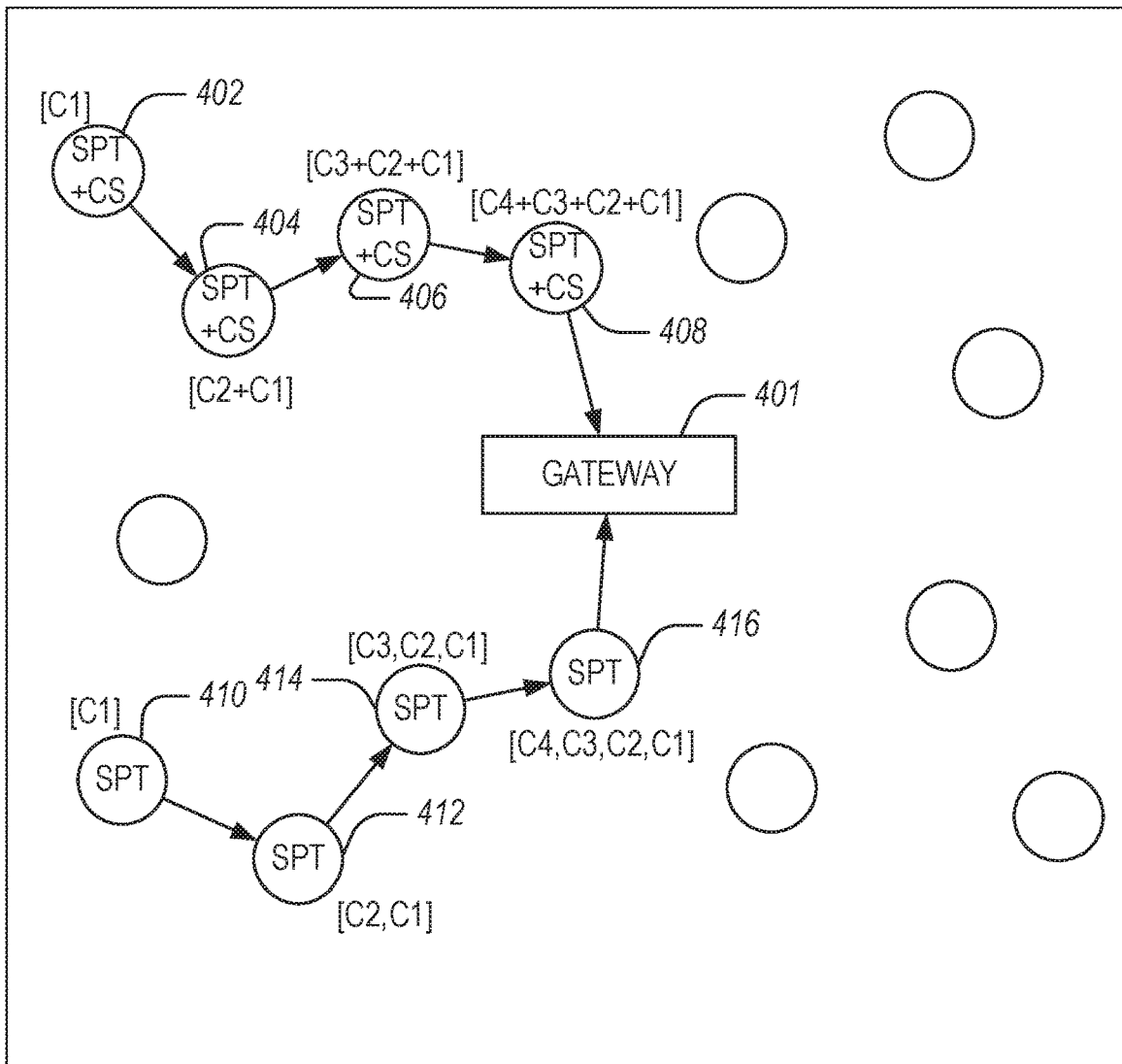
FIG. 4 illustrates a data gathering mesh network using a compressive sensing (CS) shortest path tree (SPT) technique and a SPT-only technique in accordance with some embodiments.

FIG. 4 illustrates a data gathering mesh network 400 using a CS-SPT technique and a SPT-only technique in accordance with some embodiments. The CS-SPT technique is shown in the branch including nodes 402, 404, 406, and 406 connected to a gateway 401. The SPT-only technique is shown in the branch including nodes 410, 412, 414, and 416 connected to the gateway 401. In the mesh network 400, an SPT-only technique gathers data from all nodes along a branch, keeping the data separate as it travels toward the gateway 401. For example, at node 416, which is a parent node to node 414 (and so on to nodes 412 and 410), the data is shown as including [C4, C3, C2, C1], for example, a sensor reading from each node 410, 412, 414, and 416.

The CS-SPT technique shown in the branch with parent node 408 uses CS encoding to reduce relay throughput for load balancing and minimize a number of nodes required for data gathering by linearly encoding data from each of the child nodes 402, 404, and 406, which is shown in FIG. 4 as [C4+C3+C2+C1]. The CS-SPT technique may capture an anomaly at any of the nodes while retaining power-efficient operation by responding to a state of the mesh network 400 (e.g., whether a sensor node or sensor nodes are at equilibrium or have anomalies), which may include switching a sampling schedule or signal recovery parameters according to the state. For example, on detection of an anomaly, the CS-SPT technique may include adaptively increasing a number of routes sampled (e.g., lowering a compression ratio—for example routes available/routes selected), such as to scan for additional anomalies or compensate for change in sparsity levels of the anomaly. In this example, the CS-SPT technique may include dynamically changing signal recovery parameters (e.g., a basis function) to parameters better suited to structural properties of the current anomalous field (e.g., sample more heavily at the anomaly). The CS-SPT technique may include performing data aggregation from a leaf node and cycling through different routes to periodically scan all network nodes for anomalies. For example, converting the route starting at node 410 to the gateway 40 from the SPT-only technique to the CS-SPT technique, the mesh network 400 may include sampling the route including node 402 at a first time interval, the route including node 410 at a second interval, and a third route (not shown) at a third time interval.

Figure 5:
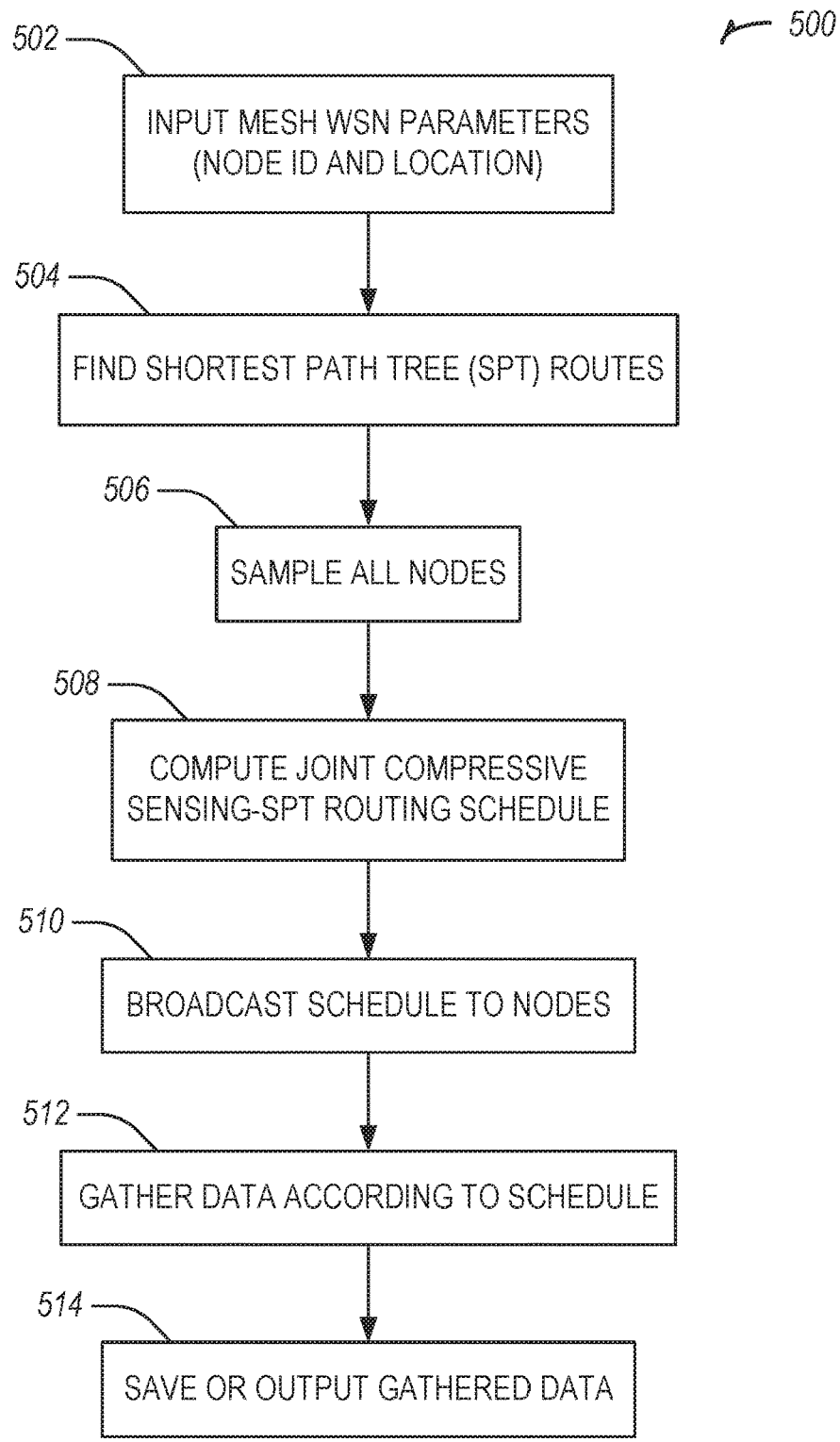
FIG. 5 illustrates a flowchart showing a technique for using CS-SPT in a mesh network in accordance with some embodiments.

FIG. 5 illustrates a flowchart showing a technique 500 for using CS-SPT in a mesh network in accordance with some embodiments.

The technique 500 includes an operation 502 to input mesh WSN parameters (e.g., Node ID and Location). The technique 500 includes an operation 504 to find shortest path tree (SPT) routes. The technique 500 includes an operation 506 to sample all nodes. The technique 500 includes an operation 508 to compute a joint CS-SPT routing schedule. The technique 500 includes an operation 510 to broadcast the schedule to nodes. The technique 500 includes an operation 512 to gather data according to the schedule. The technique 500 includes an operation 514 to save or output the gathered data.

TABLE 1

Increase in network lifetime and load balancing results using CS-SPT technique over SPT-only technique

| Network Size | # of Children for Worst Case Relay | Network Lifetime Increase using CS-SPT over SPT-only | | Number of Transmissions for Worst Case Relay | |
|---|---|---|---|---|---|
| | | Sensor Node | Node with Wake Up Radio HW | SPT-only | CS-SPT |
| ~100 nodes, 3 hops | 17 | 1.17x | 1.56x | 17 | ~3-6 |
| ~350 nodes, 4 hops | 73 | 2.86x | 3.5x | 73 | ~16-19 |
| ~600 nodes, 3 hops | 85 | 2.4x | 3.45x | 85 | ~17-20 |

In an example, the CS-SPT technique 500 may achieve better load-balancing and be more energy-efficient compared to an SPT-only technique. In an example, the CS-SPT technique 500 may use a subset (e.g., 15-20%) of a total number of transmissions or measurements that are used in an SPT-only technique to recover the entire sparse sensor field accurately. The CS-SPT technique 500 may increase network lifetime by as much as 3.5× over a similar or same network using a SPT-only technique, in an asset tracking temperature network, as demonstrated in Table 1. In the example shown in Table 1, the CS-SPT technique reduces a number of transmissions for relay nodes that are close (e.g., within zero nodes, one node, two nodes, etc.) to a gateway. Reducing the number of transmissions may result in an improved load balanced architecture. In an example, the CS-SPT technique 500 may detect variations in spatio-temporal properties of a sensor field by dynamically changing the schedule or signal recovery parameters (e.g., compression ratio, sparse basis, etc.), which allows for recovery of anomalous fields (e.g., hot spots) with low power.

Figure 6A:
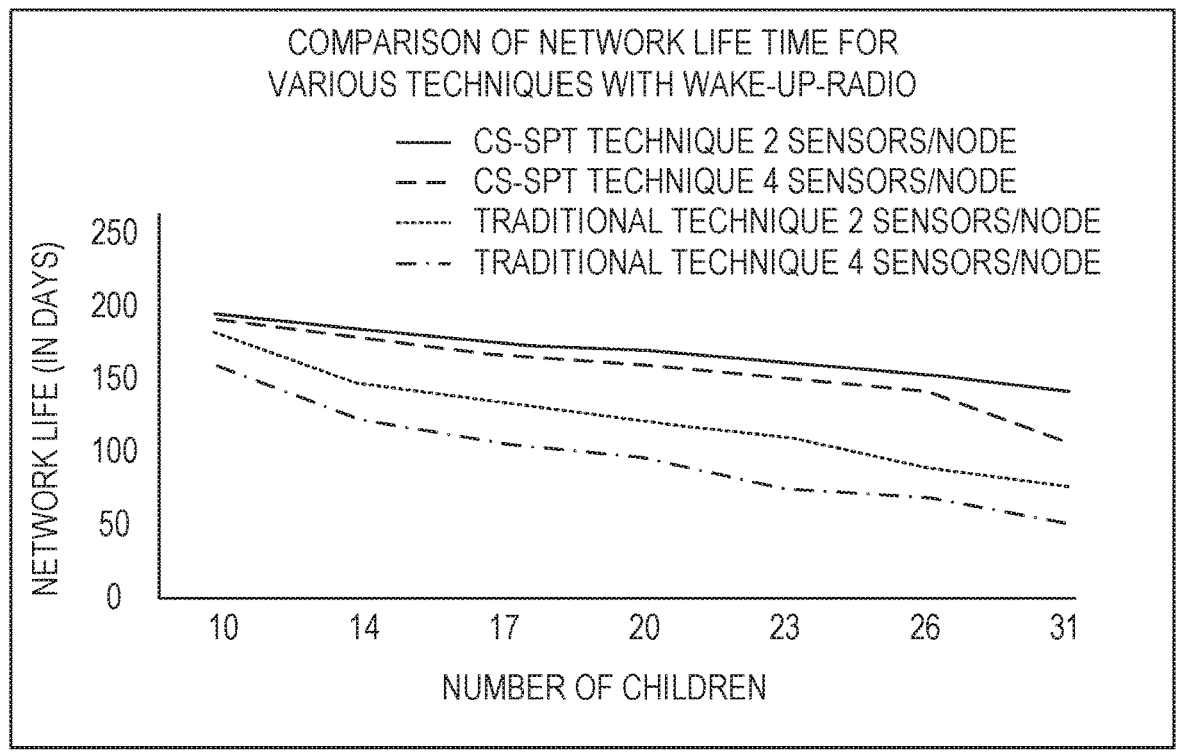
FIG. 6A illustrates a network life time graph and FIG. 6B illustrates a power savings graph using various techniques in accordance with some embodiments.
Figure 6B:
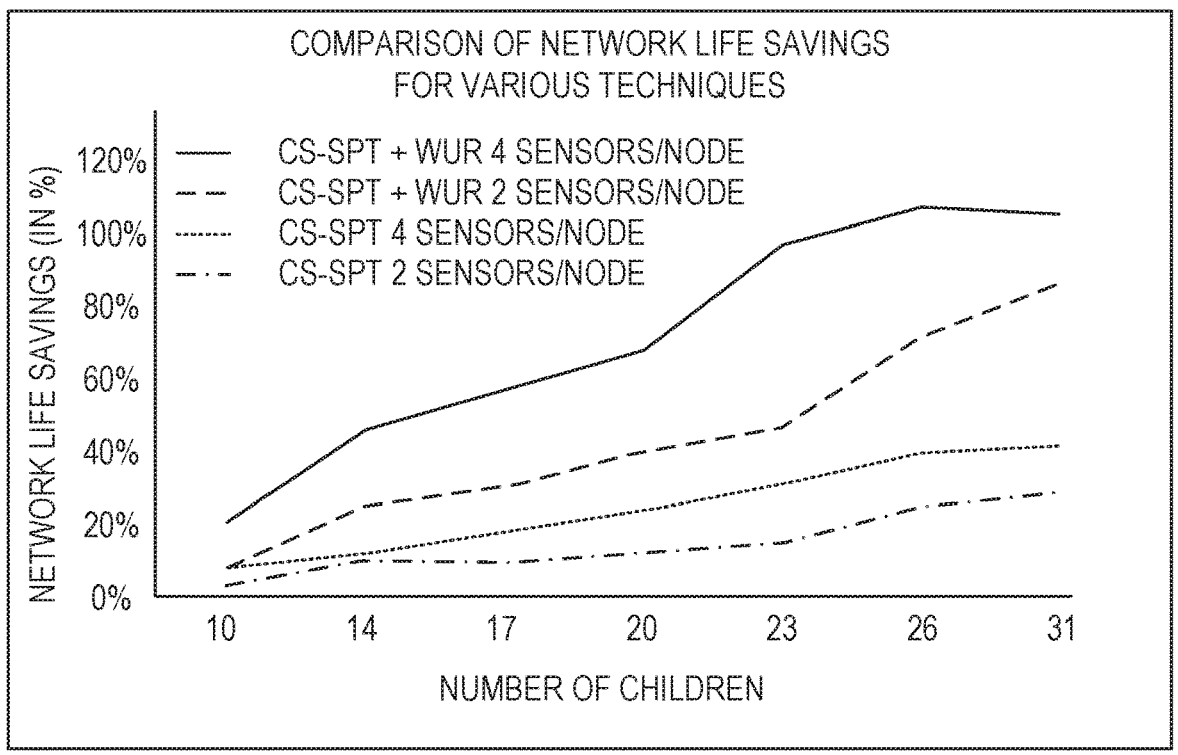

FIG. 6A illustrates a network life time graph 600 and FIG. 6B illustrates a power savings graph 601 using various techniques in accordance with some embodiments.

In the examples shown in the network life time graph 600 and the power savings graph 601, a particular type of sensor field is used for a mesh network, however, other types of sensor fields or applications may be used with the SPT-CS technique. In the examples of FIGS. 6A and 6B, a spatial temperature field was synthetically generated using Computational Fluid Dynamics (CFD) models of a cold chain refrigerated container, as seen in asset tracking applications. The results illustrate network lifetime increases ranging from 1.2×-3.5×, depending on the number of sensors, number of children for worst case relay, network size and HW configuration. Unlike the SPT-only method where the throughput increases exponentially as the number of children for a relay node increases, the throughput remains relatively unchanged using the CS-SPT technique.

The network life time graph 600 illustrates a comparison of the SPT-only technique (called "traditional technique" in FIG. 6A) to the CS-SPT technique in an example. The network life time graph includes two example mesh networks, a first with 2 sensors per node and a second with 4 sensors per node. As shown in network life time graph 600, the CS-SPT technique for the mesh network 2 sensors per node has a longer network life for any number of children over the SPT-only technique for the mesh network with 2 sensors per node. Similarly, for the mesh network with 4 sensors per node, the CS-SPT technique has longer network life than the SPT-only technique for any number of children.

The power savings graph 601 illustrates network life savings percentages for the CS-SPT technique over the SPT-only technique in various circumstances, including with 2 or 4 sensors per node, and in worst case relay (WUR) examples. The network life savings increase for the complexity of the network with greater savings for a 4 sensor per node network than a 2 sensor per node network. The network life savings also increase for worst case relay examples over non-worst case relay examples.

Figure 7:
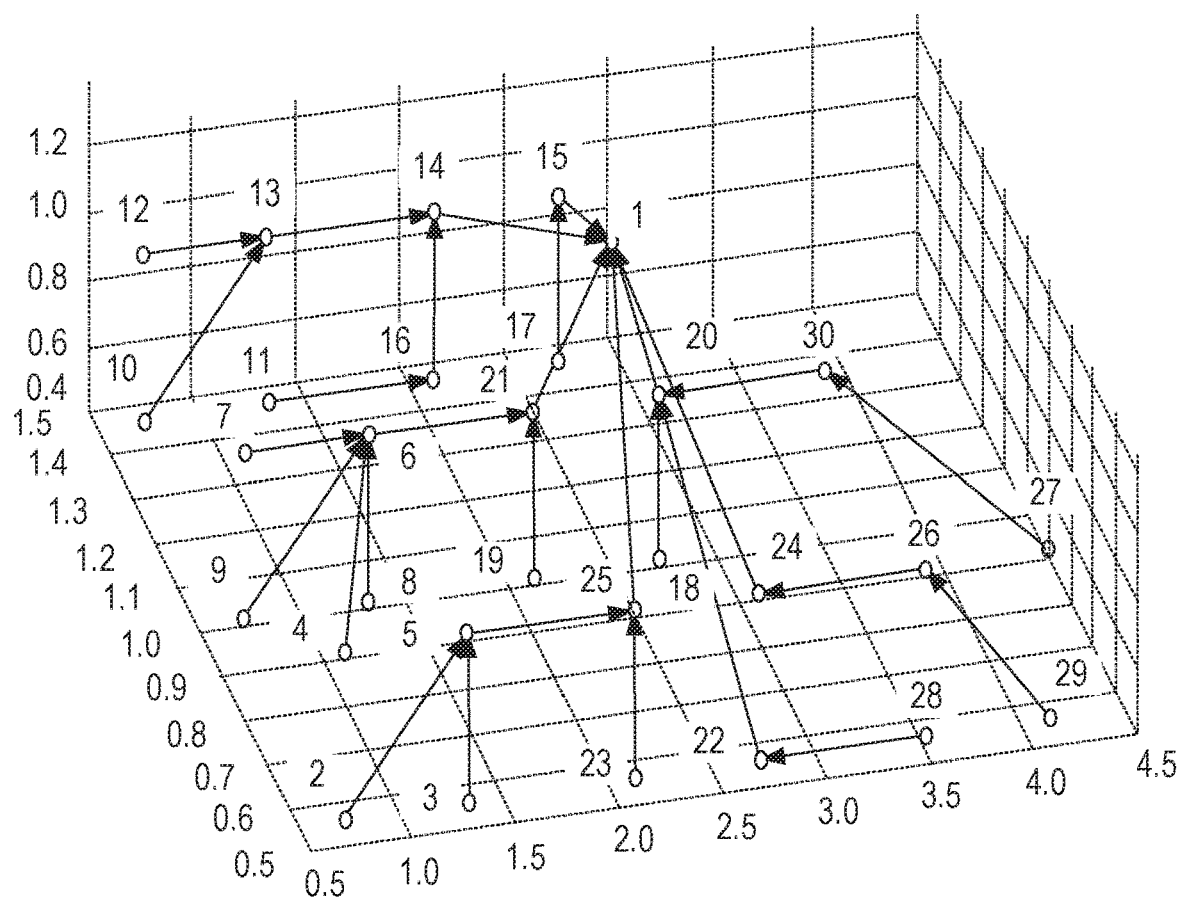
FIG. 7 illustrates an example graph showing SPT-only routes in accordance with some embodiments.

FIG. 7 illustrates an example graph 700 showing SPT-only routes in accordance with some embodiments. The graph 700 includes a mesh network, for example including a plurality of nodes (e.g., labeled 2-30), a gateway (labeled 1), and a plurality of connections between the nodes. A set of routes from each sensor node to the gateway 1 may be determined for the mesh network shown in graph 700 using the SPT technique (e.g., with Dijkstra's algorithm), based on network constraints (e.g., number of nodes, radio range, etc.). The SPT technique minimizes the number of hops for a node to reach the gateway 1, and determines an optimal set of paths. The CS technique may be used with the routes (determined using the SPT technique) on the mesh network by decreasing transmissions per relay. The CS technique may report a single transmission per routing path to load balance. The CS technique may decrease the number of nodes/routes required to participate in a data gathering process to save network power.

To combine the SPT and CS techniques and compute the integrated CS-SPT data gathering schedule, the CS portion uses the SPT generated routes, a set of raw measurements of the sensor field of the mesh network (e.g., sensor readings from one or more sensors at nodes 2-30 or a portion of those nodes), and a desired compression ratio. The CS-SPT data gathering schedule may be computed on the gateway device 1. In an example, the gateway device 1 may determine operating parameters (e.g., recovery basis).

In an example, the CS-SPT algorithm reports a subset of measurements (e.g., not from all nodes or not from all sensors of a node or nodes) at any given time. In this example, the entire sensor field may be determined by, for example, using an optimization technique, such as a L1-norm minimization algorithm, which may include a non-decimated transform (DCT). The gateway 1 may determine the entire sensor field using the optimization technique, such as by determining an overcomplete DCT, such as on an identity basis. The CS-SPT routes may be cycled through at different time steps, such as to scan for anomalies using a thresholding logic. The cycling technique may be used to cover and scan all the nodes of the network (e.g., over a period of cycles or time).

Figure 8:
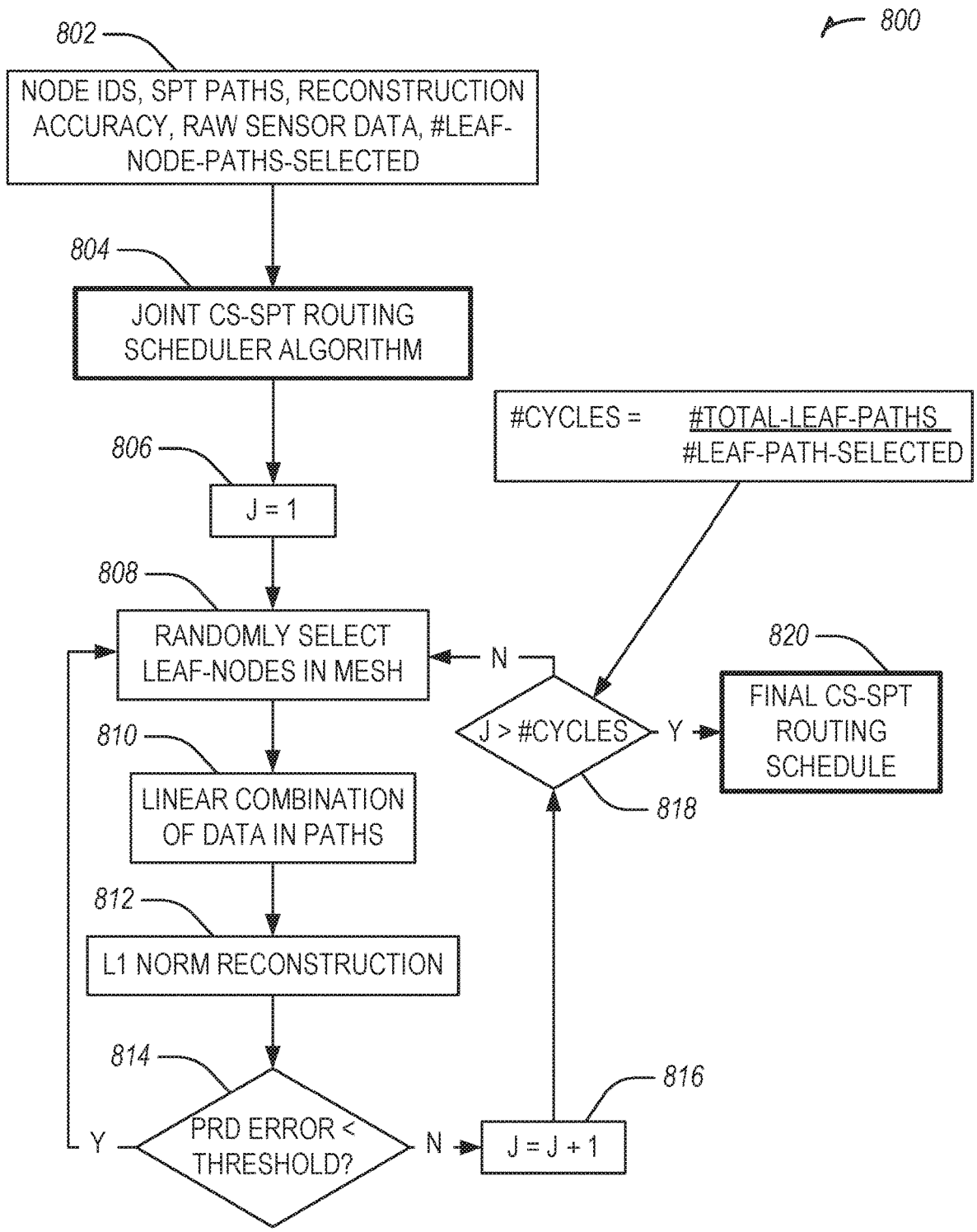
FIG. 8 illustrates a CS-SPT scheduling technique in accordance with some embodiments.

FIG. 8 illustrates a CS-SPT scheduling technique 800 in accordance with some embodiments. The CS-SPT scheduling technique 800 may be used to determine a data gathering schedule for a mesh network. The technique 800 includes an operation 802 to receive information and construct SPT routes. The information may include node identification, reconstruction accuracy, raw sensor data (e.g., sensor readings such as temperature, pressure, force, etc.), or a number of routes selected. The technique 800 includes an operation 804 to determine a data gathering schedule using a CS-SPT technique.

CS-based data aggregation in a spatial network may include representing the sampling schedule (or measurement matrix) by $\Phi$ as shown in Equation 1 below. In an example, the constraints on $\Phi$ require that $\Phi$ satisfy the SPT-only routing constraints. For example, each row of $\Phi$ may correspond to one of the SPT-generated routes. An SPT generated path (e.g., a row of $\Phi$ matrix) may be represented by populating 1s in the columns corresponding to active nodes for that particular path and by populating 0s in all other columns). The measurement matrix, $\Phi$, when populated in this way, may be incoherent with DCT/DCT-identity basis, which may cause good reconstruction.

$$Y = \begin{bmatrix} 1 & 0 & 1 & 0 & 0 & 0 \\ 0 & 0 & 1 & 1 & 0 & 0 \\ 0 & 1 & 0 & 0 & 1 & 1 \\ 1 & 1 & 0 & 0 & 0 & 1 \end{bmatrix} \begin{bmatrix} S1 \\ S2 \\ S3 \\ S4 \\ S5 \\ \vdots \\ Sn \end{bmatrix} \quad \text{Eq. 1}$$

Example of an optimal CS-SPT sampling matrix Φ calculated using the CS-SPT technique, where the first matrix is Φ and the second matrix is X.

In Equation 1, X may represent the spatial temperature sensor field (e.g., the collection of all sensor nodes). Each row in the Φ matrix may represent one selected path in the current schedule based upon the SPT technique. The inner-product of each row may represent the data aggregation process within the sensor network (e.g., receive-multiply-add-accumulate-forward). The total number of transmissions in the CS-SPT mesh network may be the total number of non-zero entries in the Φ matrix. The Φ matrix may be populated by the CS-scheduling technique, which may choose a best set of available SPT-routes for maximum power savings objective and signal recovery requirements.

The technique 800 includes an operation 806 to initialize set J, a current step in the cycle to 1. The technique 800 includes an operation 808 to randomly (or pseudo-randomly) select a leaf-node or leaf-nodes in the mesh network (e.g., one of the nodes 2-30). The technique 800 includes an operation 810 to create a linear combination of data along a path (e.g., at a node selected from the route, such as a parent node).

The technique 800 includes an operation 812 to perform a reconstruction, such as a L1 normalization reconstruction. In an example, data may be aggregated in a CS-SPT route according to the Φ matrix, resulting in one transmission per path (e.g., the inner product). The non-zero measurements may be projected onto Y through the network to the gateway. At the gateway, the entire sensor field may be reconstructed using the L1-norm formulation shown in Equation 2 below.

$$\text{L1-norm recovery: min } \{\|x\|_1 : \Phi \Psi^{-1} x = y\} \qquad \text{Eq. 2}$$

In Equation 2, x is the actual sensor field, which may be reconstructed on the gateway. Φ is the sparsest measurement matrix or schedule. Φ includes a reduced number of measurements and may include a measure of the power savings in the network. ψ is the sparse basis (e.g. DCT/overcomplete DCT-identity) for the particular sensor field. In an example, y is the set of actual measurements that are made.

The technique 800 includes a decision operation 814 to determine whether a Percentage Root Mean-Square Difference (PRD) error is less than a threshold. For example, the threshold may be user selected, such as within 5%. When the PRD error is less than the threshold, the technique 800 may return to operation 808. When the PRD error is greater than the threshold, the technique 800 includes an operation 816 to increment J, the current step in the cycle by 1. The technique 800 includes an operation to then determine whether J, the current step in the cycle is greater than a specified number of cycles (e.g., the total number of cycles according to the SPT generated route). When the current step is greater than the specified number of cycles, the technique 800 includes an operation 820 to determine a final CS-SPT routing schedule, which may be output or stored at the gateway. When the current step is less than or equal to the specified number of cycles, the technique 800 may return to operation 808 to select a next leaf node. In an example, the random selection is configured such that the same leaf node is not selected a second time during this iterative processing (e.g., the leaf paths are selected without replacement). In an example, the specified number of cycles may be determined by taking a total number of leaf paths and dividing that number by a number of leaf paths selected.

In an example, the CS-SPT technique 800 may select only 13 out of 44 available paths (compression ratio=5) and use DCT basis for reconstruction, which may result in a small error, (e.g., PRD=1.8%). PRD may be a metric used to capture the performance of the reconstruction using the CS-SPT technique 800. In an example, such as compared to a brute force SPT-only scheme, only ~22-23 out of 72 nodes may be used to participate in the CS-SPT based data gathering technique 800.

In an example, on detection of an anomaly, such as when a signal transverses a threshold, the CS-SPT technique 800 may adaptively increase a number of routes sampled in the data gathering schedule, such as by lowering a compression ratio. The increase in number of routes sampled include scanning for additional anomalies or compensating for a change in sparsity levels of the signal. In an example, the number of routes sampled may be increased by dynamically switching to signal recovery parameters (e.g., basis function), which are well suited to the structural properties of the anomalous field.

Figure 9:
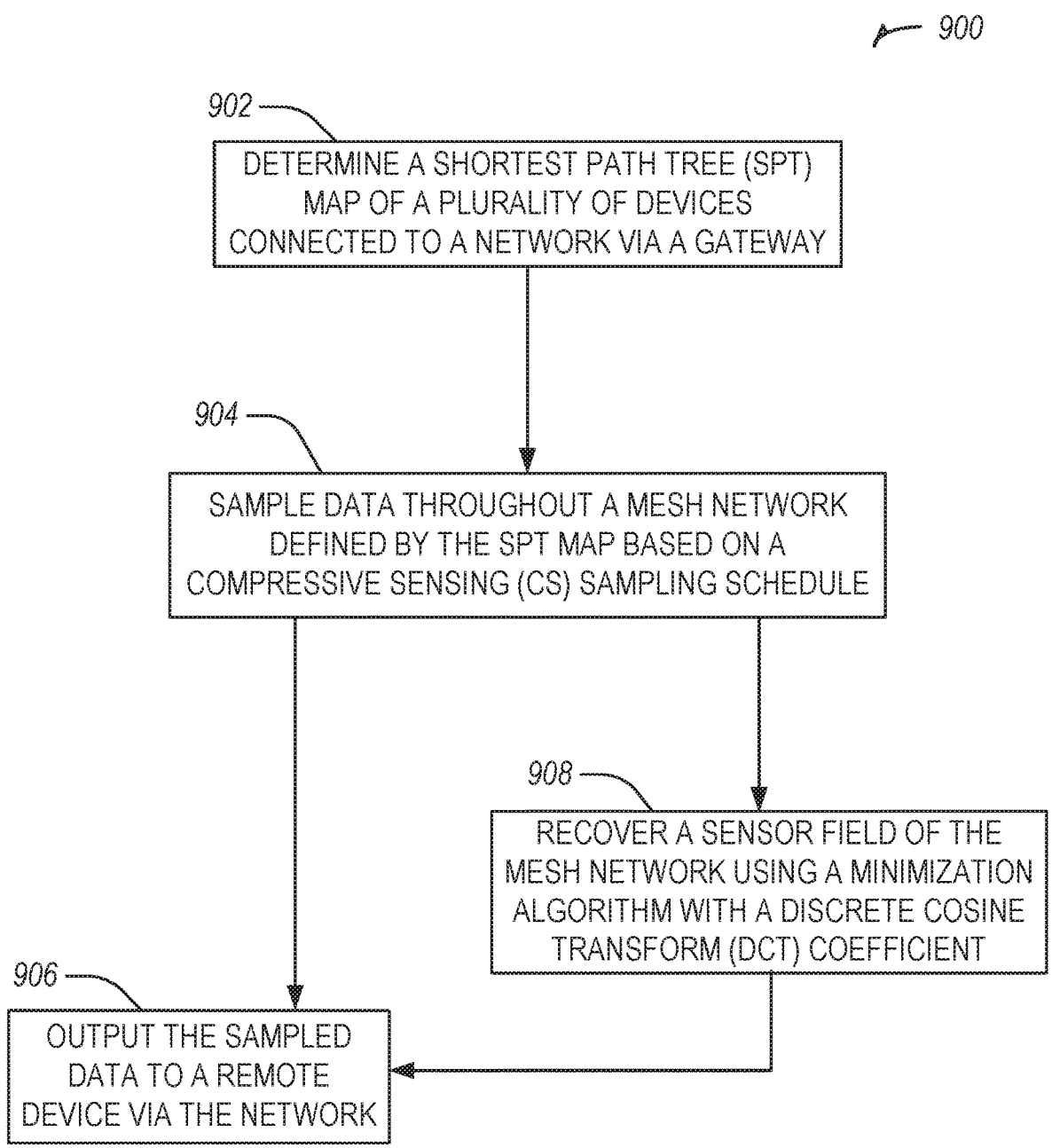
FIG. 9 illustrates a flowchart showing a technique for using CS-SPT to map and collect data from a mesh network in accordance with some embodiments.

FIG. 9 illustrates a flowchart showing a technique 900 for using CS-SPT to map and collect data from a mesh network in accordance with some embodiments. The technique 900 includes an operation 902 to determine a shortest path tree (SPT) map of a plurality of devices connected to a network via a gateway. The technique 900 may be performed when connections among the plurality of devices are unknown. In an example, the technique 900 may be performed when connections between the gateway and one or more, including all, of the plurality of devices are unknown. In an example, the SPT may be determined using Dijkstra's algorithm, such as by using network constraints including, for example, a total number of nodes or radio ranges of nodes.

The technique 900 includes an operation 904 to sample data throughout a mesh network defined by the SPT map based on a compressive sensing (CS) sampling schedule. In an example, sampling data throughout the mesh network includes receiving an encoded reading from a parent node connected to the gateway in the mesh network. The encoded reading may include a linearly combined reading from each child node connected within the SPT map to the parent node. In an example, sampling data may include increasing a number of routes sampled in response to detecting an anomaly at a node within the SPT map (e.g., an alarm, alert, error, etc.). In this example, signal recovery parameters may be dynamically changed based on the detected anomaly. In an example, sampling data includes cycling through routes connected to the gateway, for example starting at each leaf node, such as an end node with no children nodes, and sampling a single transmission per route. The cycling may continue until all routes have been sampled.

In an example, operation 906 or 908 described below may be used optionally interchangeably or together, either operation may be performed first or second or simultaneously. The technique 900 includes an operation 906 to output the sampled data to a remote device via the network. The technique 900 includes an operation 908 to recover a sensor field of the mesh network using a minimization algorithm with a discrete cosine transform (DCT) coefficient, for example at the gateway. In an example, the sensor field or information related to the sensor field, such as an alert or error, may be output (e.g., sent to operation 906) to a remote device.

In other examples, the operations and functionality described above with reference to FIGS. 3 to 9 may be embodied by an IoT device machine in the example form of an electronic processing system, within which a set or sequence of instructions may be executed to cause the electronic processing system to perform any one of the methodologies discussed herein, according to an example embodiment. The machine may be an IoT device or an IoT gateway, including a machine embodied by aspects of a personal computer (PC), a tablet PC, a personal digital assistant (PDA), a mobile telephone or smartphone, or any machine capable of executing instructions (sequential or otherwise) that specify actions to be taken by that machine. Further, while only a single machine may be depicted and referenced in the example above, such machine shall also be taken to include any collection of machines that individually or, jointly execute a set (or multiple sets) of instructions to perform any one or more of the methodologies discussed herein. Further, these and like examples to a processor-based system shall be taken to include any set of one or more machines that are controlled by or operated by a processor (e.g., a computer) to individually or jointly execute instructions to perform any one or more of the methodologies discussed herein.

Figure 10:
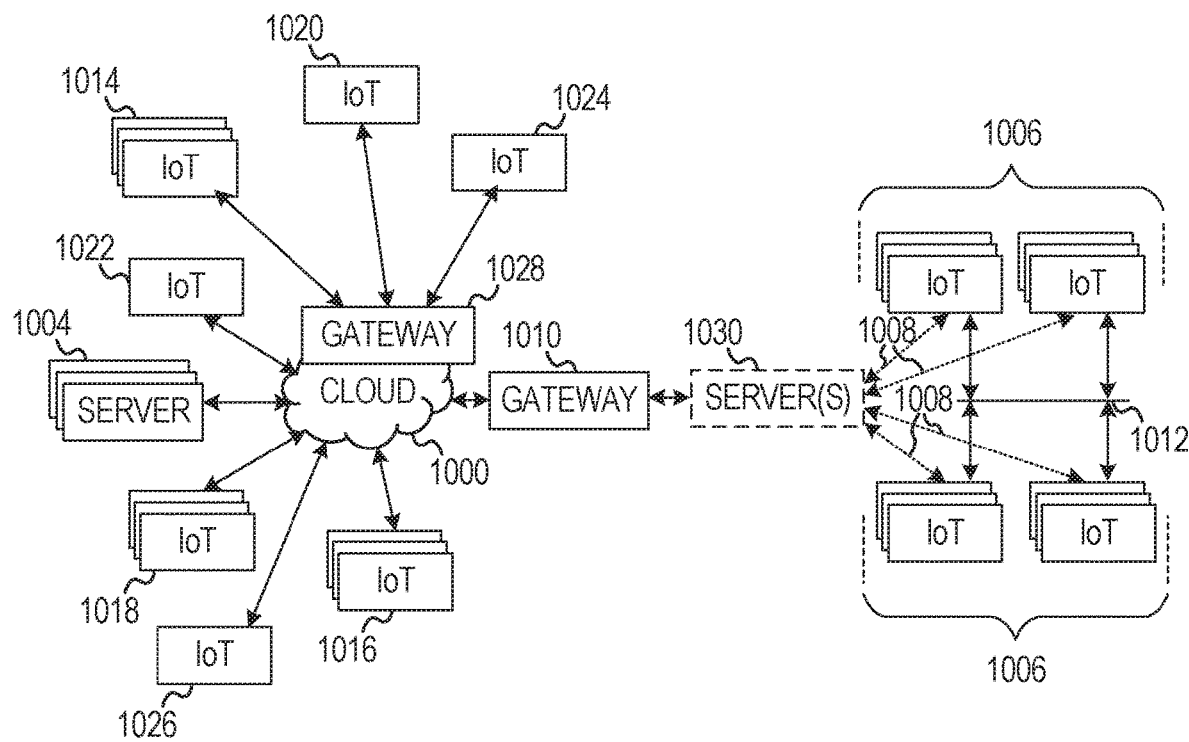
FIG. 10 illustrates a block diagram of a network illustrating communications among a number of IoT devices in accordance with some embodiments.

FIG. 10 illustrates a drawing of a cloud computing network, or cloud 1000, in communication with a number of Internet of Things (IoT) devices. The cloud 1000 may represent the Internet, or may be a local area network (LAN), or a wide area network (WAN), such as a proprietary network for a company. The IoT devices may include any number of different types of devices, grouped in various combinations. For example, a traffic control group 1006 may include IoT devices along streets in a city. These IoT devices may include stoplights, traffic flow monitors, cameras, weather sensors, and the like. The traffic control group 1006, or other subgroups, may be in communication with the cloud 1000 through wired or wireless links 1008, such as LPWA links, optical links, and the like. Further, a wired or wireless sub-network 1012 may allow the IoT devices to communicate with each other, such as through a local area network, a wireless local area network, and the like. The IoT devices may use another device, such as a gateway 1010 or 1028 to communicate with remote locations such as the cloud 1000; the IoT devices may also use one or more servers 1030 to facilitate communication with the cloud 1000 or with the gateway 1010. For example, the one or more servers 1030 may operate as an intermediate network node to support a local edge cloud or fog implementation among a local area network. Further, the gateway 1028 that is depicted may operate in a cloud-to-gateway-to-many edge devices configuration, such as with the various IoT devices 1014, 1020, 1024 being constrained or dynamic to an assignment and use of resources in the cloud 1000.

Other example groups of IoT devices may include remote weather stations 1014, local information terminals 1016, alarm systems 1018, automated teller machines 1020, alarm panels 1022, or moving vehicles, such as emergency vehicles 1024 or other vehicles 1026, among many others. Each of these IoT devices may be in communication with other IoT devices, with servers 1004, with another IoT fog device or system (not shown, but depicted in FIG. 2), or a combination therein. The groups of IoT devices may be deployed in various residential, commercial, and industrial settings (including in both private or public environments).

As can be seen from FIG. 10, a large number of IoT devices may be communicating through the cloud 1000. This may allow different IoT devices to request or provide information to other devices autonomously. For example, a group of IoT devices (e.g., the traffic control group 1006) may request a current weather forecast from a group of remote weather stations 1014, which may provide the forecast without human intervention. Further, an emergency vehicle 1024 may be alerted by an automated teller machine 1020 that a burglary is in progress. As the emergency vehicle 1024 proceeds towards the automated teller machine 1020, it may access the traffic control group 1006 to request clearance to the location, for example, by lights turning red to block cross traffic at an intersection in sufficient time for the emergency vehicle 1024 to have unimpeded access to the intersection.

Clusters of IoT devices, such as the remote weather stations 1014 or the traffic control group 1006, may be equipped to communicate with other IoT devices as well as with the cloud 1000. This may allow the IoT devices to form an ad-hoc network between the devices, allowing them to function as a single device, which may be termed a fog device or system (e.g., as described above with reference to FIG. 2).

Figure 11:
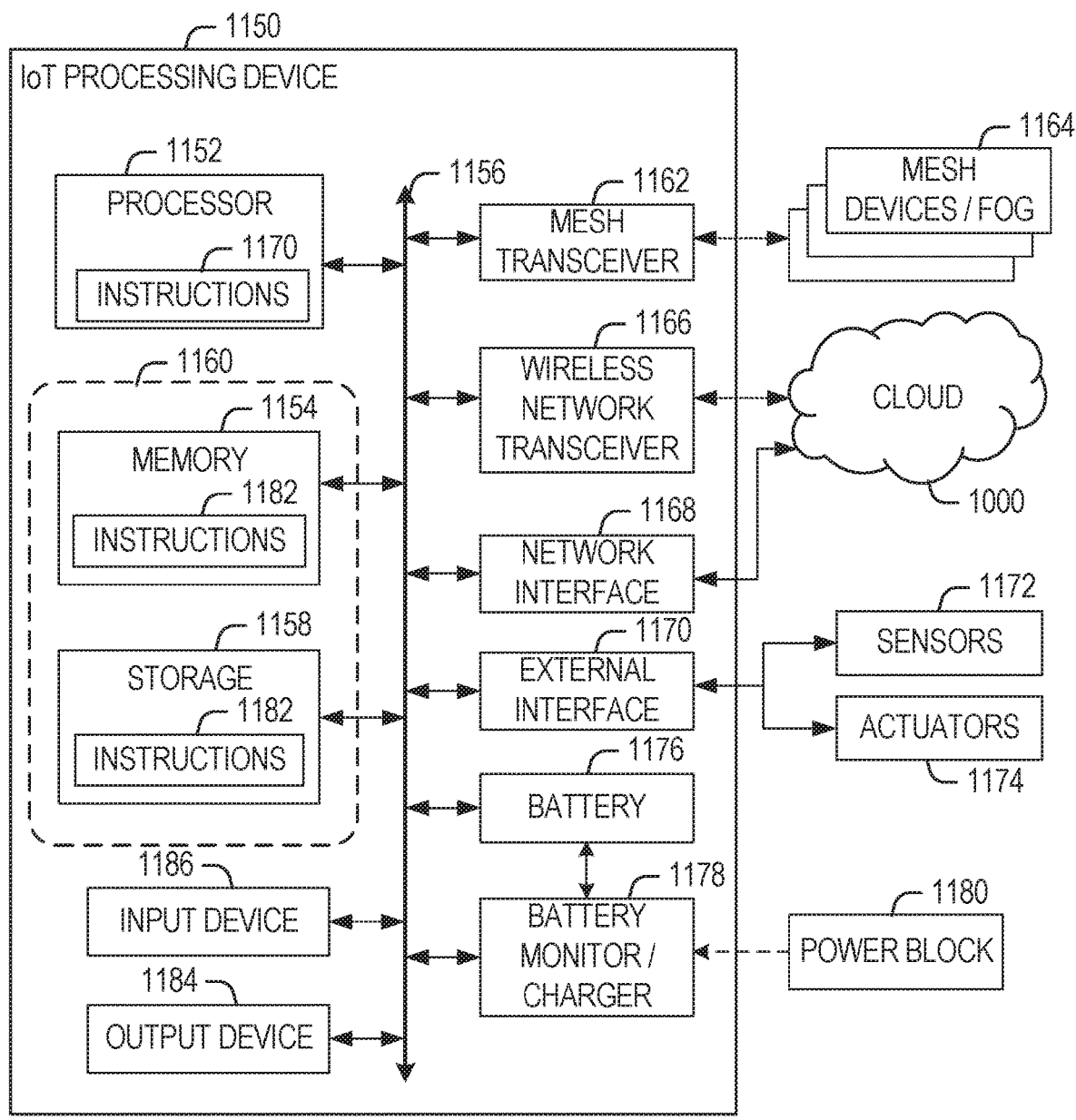
FIG. 11 illustrates a block diagram for an example IoT processing system architecture upon which any one or more of the techniques (e.g., operations, processes, methods, and methodologies) discussed herein may be performed in accordance with some embodiments.

FIG. 11 is a block diagram of an example of components that may be present in an IoT device 1150 for implementing the techniques described herein. The IoT device 1150 may include any combinations of the components shown in the example or referenced in the disclosure above. The components may be implemented as ICs, portions thereof, discrete electronic devices, or other modules, logic, hardware, software, firmware, or a combination thereof adapted in the IoT device 1150, or as components otherwise incorporated within a chassis of a larger system. Additionally, the block diagram of FIG. 11 is intended to depict a high-level view of components of the IoT device 1150. However, some of the components shown may be omitted, additional components may be present, and different arrangement of the components shown may occur in other implementations.

The IoT device 1150 may include a processor 1152, which may be a microprocessor, a multi-core processor, a multi-threaded processor, an ultra-low voltage processor, an embedded processor, or other known processing element. The processor 1152 may be a part of a system on a chip (SoC) in which the processor 1152 and other components are formed into a single integrated circuit, or a single package, such as the Edison™ or Galileo™ SoC boards from Intel. As an example, the processor 1152 may include an Intel® Architecture Core™ based processor, such as a Quark™, an Atom™, an i3, an i5, an i7, or an MCU-class processor, or another such processor available from Intel® Corporation, Santa Clara, Calif. However, any number other processors may be used, such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters. The processors may include units such as an A5-A10 processor from Apple® Inc., a Snapdragon™ processor from Qualcomm® Technologies, Inc., or an OMAP™ processor from Texas Instruments, Inc.

The processor 1152 may communicate with a system memory 1154 over an interconnect 1156 (e.g., a bus). Any number of memory devices may be used to provide for a given amount of system memory. As examples, the memory may be random access memory (RAM) in accordance with a joint Electron Devices Engineering Council (JEDEC) design such as the DDR or mobile DDR standards (e.g., LPDDR, LPDDR2, LPDDR3, or LPDDR4). In various implementations the individual memory devices may be of any number of different package types such as single die package (SDP), dual die package (DDP) or quad die package (Q17P). These devices, in some examples, may be directly soldered onto a motherboard to provide a lower profile solution, while in other examples the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs.

To provide for persistent storage of information such as data, applications, operating systems and so forth, a storage 1158 may also couple to the processor 1152 via the interconnect 1156. In an example the storage 1158 may be implemented via a solid state disk drive (SSDD). Other devices that may be used for the storage 1158 include flash memory cards, such as SD cards, microSD cards, xD picture cards, and the like, and USB flash drives. In low power implementations, the storage 1158 may be on-die memory or registers associated with the processor 1152. However, in some examples, the storage 1158 may be implemented using a micro hard disk drive (HDD). Further, any number of new technologies may be used for the storage 1158 in addition to, or instead of, the technologies described, such resistance change memories, phase change memories, holographic memories, or chemical memories, among others.

The components may communicate over the interconnect 1156. The interconnect 1156 may include any number of technologies, including industry standard architecture (ISA), extended ISA (EISA), peripheral component interconnect (PCI), peripheral component interconnect extended (PCIx), PCI express (PCIe), or any number of other technologies. The interconnect 1156 may be a proprietary bus, for example, used in a SoC based system. Other bus systems may be included, such as an I2C interface, an SPI interface, point to point interfaces, and a power bus, among others.

The interconnect 1156 may couple the processor 1152 to a mesh transceiver 1162, for communications with other mesh devices 1164. The mesh transceiver 1162 may use any number of frequencies and protocols, such as 2.4 Gigahertz (GHz) transmissions under the IEEE 802.15.4 standard, using the Bluetooth® low energy (BLE) standard, as defined by the Bluetooth® Special Interest Group, or the ZigBee® standard, among others. Any number of radios, configured for a particular wireless communication protocol, may be used for the connections to the mesh devices 1164. For example, a WLAN unit may be used to implement Wi-Fi™ communications in accordance with the Institute of Electrical and Electronics Engineers (IEEE) 802.11 standard. In addition, wireless wide area communications, e.g., according to a cellular or other wireless wide area protocol, may occur via a WWAN unit.

The mesh transceiver 1162 may communicate using multiple standards or radios for communications at different range. For example, the IoT device 1150 may communicate with close devices, e.g., within about 10 meters, using a local transceiver based on BLE, or another low power radio, to save power. More distant mesh devices 1164, e.g., within about 50 meters, may be reached over ZigBee or other intermediate power radios. Both communications techniques may take place over a single radio at different power levels, or may take place over separate transceivers, for example, a local transceiver using BLE and a separate mesh transceiver using ZigBee.

A wireless network transceiver 1166 may be included to communicate with devices or services in the cloud 1100 via local or wide area network protocols. The wireless network transceiver 1166 may be a LPWA transceiver that follows the IEEE 802.15.4, or IEEE 802.15.4g standards, among others. The IoT device 1150 may communicate over a wide area using LoRaWAN™ (Long Range Wide Area Network) developed by Semtech and the LoRa Alliance. The techniques described herein are not limited to these technologies, but may be used with any number of other cloud transceivers that implement long range, low bandwidth communications, such as Sigfox, and other technologies. Further, other communications techniques, such as time-slotted channel hopping, described in the IEEE 802.15.4e specification may be used.

Any number of other radio communications and protocols may be used in addition to the systems mentioned for the mesh transceiver 1162 and wireless network transceiver 1166, as described herein. For example, the radio transceivers 1162 and 1166 may include an LTE or other cellular transceiver that uses spread spectrum (SPA/SAS) communications for implementing high speed communications. Further, any number of other protocols may be used, such as Wi-Fi® networks for medium speed communications and provision of network communications.

The radio transceivers 1162 and 1166 may include radios that are compatible with any number of 3GPP (Third Generation Partnership Project) specifications, notably Long Term Evolution (LTE), Long Term Evolution-Advanced (LTE-A), and Long Term Evolution-Advanced Pro (LTE-A Pro). It can be noted that radios compatible with any number of other fixed, mobile, or satellite communication technologies and standards may be selected. These may include, for example, any Cellular Wide Area radio communication technology, which may include e.g. a 5th Generation (5G) communication systems, a Global System for Mobile Communications (GSM) radio communication technology, a General Packet Radio Service (GPRS) radio communication technology, or an Enhanced Data Rates for GSM Evolution. (EDGE) radio communication technology, a UMTS (Universal Mobile Telecommunications System) communication technology, In addition to the standards listed above, any number of satellite uplink technologies may be used for the wireless network transceiver 1166, including, for example, radios compliant with standards issued by the ITU (International Telecommunication Union), or the ETSI (European Telecommunications Standards Institute), among others. The examples provided herein are thus understood as being applicable to various other communication technologies, both existing and not yet formulated.

A network interface controller (NIC) 1168 may be included to provide a wired communication to the cloud 1100 or to other devices, such as the mesh devices 1164. The wired communication may provide an Ethernet connection, or may be based on other types of networks, such as Controller Area Network (CAN), Local Interconnect Network (LIN), DeviceNet, ControlNet, Data Highway+, PROFIBUS, or PROFINET, among many others. An additional NIC 1168 may be included to allow connect to a second network, for example, a NIC 1168 providing communications to the cloud over Ethernet, and a second NIC 1168 providing communications to other devices over another type of network.

The interconnect 1156 may couple the processor 1152 to an external interface 1170 that is used to connect external devices or subsystems. The external devices may include sensors 1172, such as accelerometers, level sensors, flow sensors, optical light sensors, camera sensors, temperature sensors, a global positioning system (GPS) sensors, pressure sensors, barometric, pressure sensors, and the like. The external interface 1170 further may be used to connect the IoT device 1150 to actuators 1174, such as power switches, valve actuators, an audible sound generator, a visual warning device, and the like.

In some optional examples, various input/output (I/O) devices may be present within, or connected to, the IoT device 1150. For example, a display or other output device 1184 may be included to show information, such as sensor readings or actuator position. An input device 1186, such as a touch screen or keypad may be included to accept input. An output device 1184 may include any number of forms of audio or visual display, including simple visual outputs such as binary status indicators (e.g., LEDs) and multi-character visual outputs, or more complex outputs such as display screens (e.g., LCD screens), with the output of characters, graphics, multimedia objects, and the like being generated or produced from the operation of the IoT device 1150.

A battery 1176 may power the IoT device 1150, although in examples in which the IoT device 1150 is mounted in a fixed location, it may have a power supply coupled to an electrical grid. The battery 1176 may be a lithium ion battery, or a metal-air battery, such as a zinc-air battery, an aluminum-air battery, a lithium-air battery, and the like.

A battery monitor/charger 1178 may be included in the IoT device 1150 to track the state of charge (SoCh) of the battery 1176. The battery monitor/charger 1178 may be used to monitor other parameters of the battery 1176 to provide failure predictions, such as the state of health (SoH) and the state of function (SoF) of the battery 1176. The battery monitor charger 1178 may include a battery monitoring integrated circuit, such as an LTC4020 or an LTC2990 from Linear Technologies, an ADT7488A from ON Semiconductor of Phoenix Ariz., or an IC from the UCD90xxx family from Texas Instruments of Dallas, Tex. The battery monitor/charger 1178 may communicate the information on the battery 1176 to the processor 1152 over the interconnect 1156. The battery monitor/charger 1178 may also include an analog-to-digital (ADC) convertor that allows the processor 1152 to directly monitor the voltage of the battery 1176 or the current flow from the battery 1176. The battery parameters may be used to determine actions that the IoT device 1150 may perform, such as transmission frequency, mesh network operation, sensing frequency, and the like.

A power block 1180, or other power supply coupled to a grid, may be coupled with the battery monitor/charger 1178 to charge the battery 1176. In some examples, the power block 1180 may be replaced with a wireless power receiver to obtain the power wirelessly, for example, through a loop antenna in the IoT device 1150. A wireless battery charging circuit, such as an LTC4020 chip from Linear Technologies of Milpitas, Calif., among others, may be included in the battery monitor/charger 1178. The specific charging circuits chosen depend on the size of the battery 1176, and thus, the current required. The charging may be performed using the Airfuel standard promulgated by the Airfuel Alliance, the Qi wireless charging standard promulgated by the Wireless Power Consortium, or the Rezence charging standard, promulgated by the Alliance for Wireless Power, among others.

The storage 1158 may include instructions 1182 in the form of software, firmware, or hardware commands to implement the techniques described herein. Although such instructions 1182 are shown as code blocks included in the memory 1154 and the storage 1158, it may be understood that any of the code blocks may be replaced with hardwired circuits, for example, built into an application specific integrated circuit (ASIC).

In an example, the instructions 1182 provided via the memory 1154, the storage 1158, or the processor 1152 may be embodied as a non-transitory, machine readable medium 1160 including code to direct the processor 1152 to perform electronic operations in the IoT device 1150. The processor 1152 may access the non-transitory, machine readable medium 1160 over the interconnect 1156. For instance, the non-transitory, machine readable medium 1160 may be embodied by devices described for the storage 1158 of FIG. 11 or may include specific storage units such as optical disks, flash drives, or any number of other hardware devices. The non-transitory, machine readable medium 1160 may include instructions to direct the processor 1152 to perform a specific sequence or flow of actions, for example, as described with respect to the flowchart(s) and block diagram(s) of operations and functionality depicted above.

In further examples, a machine-readable medium also includes any tangible medium that is capable of storing, encoding or carrying instructions for execution by a machine and that cause the machine to perform any one or more of the methodologies of the present disclosure or that is capable of storing, encoding or carrying data structures utilized by or associated with such instructions. A "machine-readable medium" thus may include, but is not limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks. The instructions embodied by a machine-readable medium may further be transmitted or received over a communications network using a transmission medium via a network interface device utilizing any one of a number of transfer protocols (e.g., HTTP).

It should be understood that the functional units or capabilities described in this specification may have been referred to or labeled as components or modules, in order to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together, but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center), than that in which the code is deployed (e.g., in a computer embedded in a sensor or robot). Similarly, operational data may be identified and illustrated herein within components or modules, and may be embodied in any suitable form and organized within any suitable type of data structure. The operational data may be collected as a single data set, or may be distributed over different locations including over different storage devices, and may exist, at least partially, merely as electronic signals on a system or network. The components or modules may be passive or active, including agents operable to perform desired functions.

VARIOUS NOTES & EXAMPLES

Each of these non-limiting examples may stand on its own, or may be combined in various permutations or combinations with one or more of the other examples.

Example 1 is a method for mapping and collecting data from a mesh network at a gateway device connecting a plurality of devices to a network: determining a shortest path tree (SPT) map of the plurality of devices, the shortest path tree map defining the mesh network for the plurality of devices connected to the gateway; sampling data throughout the mesh network based on a compressive sensing (CS) sampling schedule; and outputting the sampled data to a remote device via the network.

In Example 2, the subject matter of Example 1 includes, wherein sampling data throughout the mesh network includes receiving an encoded reading from a parent node connected to the gateway in the mesh network.

In Example 3, the subject matter of Example 2 includes, wherein the encoded reading includes a linearly combined reading from each child node connected within the SPT map to the parent node.

In Example 4, the subject matter of Examples 1-3 includes, wherein connections among the plurality of devices are unknown before determining the SPT map.

In Example 5, the subject matter of Examples 1-4 includes, wherein connections between the gateway and all of the plurality of devices are unknown before determining the SPT map.

In Example 6, the subject matter of Examples 1-5 includes, wherein sampling data includes increasing a number of routes sampled in response to detecting an anomaly at a node within the SPT map.

In Example 7, the subject matter of Example 6 includes, dynamically changing signal recovery parameters based on the detected anomaly.

In Example 8, the subject matter of Examples 1-7 includes, wherein sampling data includes cycling through routes connected to the gateway starting at each leaf node, and producing a single transmission per route.

In Example 9, the subject matter of Examples 1-8 includes, wherein the SPT map is determined using Dijkstra's algorithm using network constraints including a total number of nodes and radio ranges of nodes.

In Example 10, the subject matter of Examples 1-9 includes, recovering an entire sensor field of the mesh network using a minimization algorithm with a discrete cosine transform (DCT) coefficient at the gateway.

Example 11 is at least one machine-readable medium including instructions for operation of a computing system, which when executed by a machine, cause the machine to perform operations of any of the methods of Examples 1-10.

Example 12 is an apparatus comprising means for performing any of the methods of Examples 1-10.

Example 13 is a gateway device for mapping and collecting data from a mesh network, the gateway device connecting a plurality of devices to a network and comprising: a processor connected to memory, the memory including instructions, which when executed by the processor cause the processor to: determine a shortest path tree (SPT) map of the plurality of devices, the shortest path tree map defining the mesh network for the plurality of devices connected to the gateway; sample data throughout the mesh network based on a compressive sensing (CS) sampling schedule; and output the sampled data, to a remote device via the network.

In Example 14, the subject matter of Example 13 includes, wherein to sample data throughout the mesh network, the processor is further to receive an encoded reading from a parent node connected to the gateway in the mesh network.

In Example 15, the subject matter of Example 14 includes, wherein the encoded reading includes a linearly combined reading from each child node connected within the SPT map to the parent node.

In Example 16, the subject matter of Examples 13-15 includes, wherein connections among the plurality of devices are unknown before determining the SPT map.

In Example 17, the subject matter of Examples 13-16 includes, wherein connections between the gateway and all of the plurality of devices are unknown before determining the SPT map.

In Example 18, the subject matter of Examples 13-17 includes, wherein to sample data, the processor is further to increase a number of routes sampled in response to detecting an anomaly at a node within the SPT map.

In Example 19, the subject matter of Example 18 includes, wherein the processor is further to dynamically change signal recovery parameters based on the detected anomaly.

In Example 20, the subject matter of Examples 13-19 includes, wherein to sample data, the processor is further to cycle through routes connected to the gateway starting at each leaf node, and produce a single transmission per route.

In Example 21, the subject matter of Examples 13-20 includes, wherein the SPT map is determined using Dijkstra's algorithm using network constraints including a total number of nodes and radio ranges of nodes.

In Example 22, the subject matter of Examples 13-21 includes, wherein the processor is further to recover an entire sensor field of the mesh network using a minimization algorithm with a discrete cosine transform (DCT) coefficient at the gateway.

Example 23 is at least one machine-readable medium including instructions for mapping and collecting data from a mesh network, which when executed by a processor of a gateway device connecting a plurality of devices to a network, cause the processor to: determine a shortest path tree (SPT) map of the plurality of devices, the shortest path tree map defining the mesh network for the plurality of devices connected to the gateway; sample data throughout the mesh network based on a compressive sensing (CS) sampling schedule; and output the sampled data to a remote device via the network.

In Example 24, the subject matter of Example 23 includes, wherein to sample data throughout the mesh network, the instructions further cause the processor to receive an encoded reading from a parent node connected to the gateway in the mesh network.

In Example 25, the subject matter of Example 24 includes, wherein the encoded reading includes a linearly combined reading from each child node connected within the SPT map to the parent node.

In Example 26, the subject matter of Examples 23-25 includes, wherein connections among the plurality of devices are unknown before determining the SPT map.

In Example 27, the subject matter of Examples 23-26 includes, wherein connections between the gateway and all of the plurality of devices are unknown before determining the SPT map.

In Example 28, the subject matter of Examples 23-27 includes, wherein to sample data, the instructions further cause the processor to increase a number of routes sampled in response to detecting an anomaly at a node within the SPT map.

In Example 29, the subject matter of Example 28 includes, wherein the instructions further cause the processor to dynamically change signal recovery parameters based on the detected anomaly.

In Example 30, the subject matter of Examples 23-29 includes, wherein to sample data, the instructions further cause the processor to cycle through routes connected to the gateway starting at each leaf node, and produce a single transmission per route.

In Example 31, the subject matter of Examples 23-30 includes, wherein the SPT map is determined using Dijkstra's algorithm using network constraints including a total number of nodes and radio ranges of nodes.

In Example 32, the subject matter of Examples 23-31 includes, wherein the instructions further cause the processor to recover an entire sensor field of the mesh network using a minimization algorithm with a discrete cosine transform (DCT) coefficient at the gateway.

Example 33 is an apparatus for mapping and collecting data from a mesh network at a gateway device connecting a plurality of devices to a network: means for determining a shortest path tree (SPT) map of the plurality of devices, the shortest path tree map defining the mesh network for the plurality of devices connected to the gateway; means for sampling data throughout the mesh network based on a compressive sensing (CS) sampling schedule; and means for outputting the sampled data to a remote device via the network.

In Example 34, the subject matter of Example 33 includes, wherein the means for sampling data throughout the mesh network include means for receiving an encoded reading from a parent node connected to the gateway in the mesh network.

In Example 35, the subject matter of Example 34 includes, wherein the encoded reading includes a linearly combined reading from each child node connected within the SPT map to the parent node.

In Example 36, the subject matter of Examples 33-35 includes, wherein connections among the plurality of devices are unknown before determining the SPT map.

In Example 37, the subject matter of Examples 33-3t includes, wherein connections between the gateway and all of the plurality of devices are unknown before determining the SPT map.

In Example 38, the subject matter of Examples 33-37 includes, wherein the means for sampling data include means for increasing a number of routes sampled in response to detecting an anomaly at a node within the SPT map.

In Example 39, the subject matter of Example 38 includes, means for dynamically changing signal recovery parameters based on the detected anomaly.

In Example 40, the subject matter of Examples 33-39 includes, wherein the means for sampling data include means for cycling through routes connected to the gateway starting at each leaf node, and producing a single transmission per route.

In Example 41, the subject matter of Examples 33-40 includes, wherein the SPT map is determined using Dijkstra's algorithm using network constraints including a total number of nodes and radio ranges of nodes.

In Example 42, the subject matter of Examples 33-41 includes, means for recovering an entire sensor field of the mesh network using a minimization algorithm with a discrete cosine transform (DCT) coefficient at the gateway.

Example 43 is at least one machine-readable medium including instructions that, when executed by processing circuitry, cause the processing circuitry to perform operations to implement of any of Examples 1-42.

Example 44 is an apparatus comprising means to implement of any of Examples 1-42.

Example 45 is a system to implement of any of Examples 1-42.

Example 46 is a method to implement of any of Examples 1-42.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

What is claimed is:

1. A gateway device for mapping and collecting data from a mesh network, the gateway device connecting a plurality of devices to a network and comprising:
   a processor connected to memory, the memory including instructions that, when executed by the processor, cause the processor to:
   determine a shortest path tree (SPT) map of the plurality of devices, the shortest path tree map defining the mesh network for the plurality of devices connected to the gateway;
   sample data throughout the mesh network based on a compressive sensing (CS) sampling schedule, wherein the CS sampling schedule uses a structural property of a sensor field mapped by the SPT map without considering a communication aspect of the mesh network, and wherein the CS sampling schedule is overlaid on a route in the SPT map; and
   output the sampled data to a remote device via the network.

2. The gateway device of claim 1, wherein to sample data throughout the mesh network, the processor is further to receive an encoded reading from a parent node connected to the gateway in the mesh network.

3. The gateway device of claim 2, wherein the encoded reading includes a linearly combined reading from each child node connected within the SPT map to the parent node.

4. The gateway device of claim 1, wherein connections among the plurality of devices are unknown before determining the SPT map.

5. The gateway device of claim 1, wherein connections between the gateway and all of the plurality of devices are unknown before determining the SPT map.

6. The gateway device of claim 1, wherein to sample data, the processor is further to increase a number of routes sampled in response to detecting an anomaly at a node within the SPT map.

7. The gateway device of claim 6, wherein the processor is further to dynamically change signal recovery parameters based on the detected anomaly.

8. The gateway device of claim 1, wherein to sample data, the processor is further to cycle through routes connected to the gateway starting at each leaf node, and producing a single transmission per route.

9. The gateway device of claim 1, wherein the SPT map is determined using Dijkstra's algorithm using network constraints including a total number of nodes and radio ranges of nodes.

10. The gateway device of claim 1, wherein the processor is further to recover an entire sensor field of the mesh network using a minimization algorithm with a discrete cosine transform (DCT) coefficient at the gateway.

11. A method for mapping and collecting data from a mesh network at a gateway device connecting a plurality of devices to a network comprising:
  determining a shortest path tree (SPT) map of the plurality of devices, the shortest path tree map defining the mesh network for the plurality of devices connected to the gateway;
  sampling data throughout the mesh network based on a compressive sensing (CS) sampling schedule, wherein the CS sampling schedule uses a structural property of a sensor field mapped by the SPT without considering a communication aspect of the mesh network, and wherein the CS data sampling schedule is overlaid on a route in the SPT map; and
  outputting the sampled data to a remote device via the network.

12. The method of claim 11, wherein sampling data throughout the mesh network includes receiving an encoded reading from a parent node connected to the gateway in the mesh network.

13. The method of claim 12, wherein the encoded reading includes a linearly combined reading from each child node connected within the SPT map to the parent node.

14. The method of claim 11, wherein sampling data includes increasing a number of routes sampled in response to detecting an anomaly at a node within the SPT map.

15. The method of claim 14, further comprising dynamically changing signal recovery parameters based on the detected anomaly.

16. The method of claim 11, wherein sampling data includes cycling through routes connected to the gateway starting at each leaf node, and producing a single transmission per route.

17. The method of claim 11, wherein the SPT map is determined using Dijkstra's algorithm using network constraints including a total number of nodes and radio ranges of nodes.

18. The method of claim 11, further comprising recovering an entire sensor field of the mesh network using a minimization algorithm with a discrete cosine transform (DCT) coefficient at the gateway.

19. At least one non-transitory machine-readable medium including instructions for mapping and collecting data from a mesh network, which when executed by a processor of a gateway device connecting a plurality of devices to a network, cause the processor to:
  determine a shortest path tree (SPT) map of the plurality of devices, the shortest path tree map defining the mesh network for the plurality of devices connected to the gateway;
  sample data throughout the mesh network based on a compressive sensing (CS) sampling schedule, wherein the CS sampling schedule uses a structural property of a sensor field mapped by the SPT without considering a communication aspect of the mesh network, and wherein the CS data sampling schedule is overlaid on a route in the SPT map; and
  output the sampled data to a remote device via the network.

20. The at least one machine-readable medium of claim 19, wherein to sample data throughout the mesh network, the instructions further cause the processor to receive an encoded reading from a parent node connected to the gateway in the mesh network.

21. The at least one machine-readable medium of claim 20, wherein the encoded reading includes a linearly combined reading from each child node connected within the SPT map to the parent node.

22. The at least one machine-readable medium of claim 19, wherein connections among the plurality of devices are unknown before determining the SPT map.

23. The at least one machine-readable medium of claim 19, wherein connections between the gateway and all of the plurality of devices are unknown before determining the SPT map.

24. The at least one machine-readable medium of claim 19, wherein to sample data, the instructions further cause the processor to increase a number of routes sampled in response to detecting an anomaly at a node within the SPT map.

25. The at least one machine-readable medium of claim 24, wherein the instructions further cause the processor to dynamically change signal recovery parameters based on the detected anomaly.

* * * * *